(12) United States Patent
Seshadri et al.

(10) Patent No.: US 8,218,376 B2
(45) Date of Patent: Jul. 10, 2012

(54) REDUCED POWER CONSUMPTION IN RETAIN-TILL-ACCESSED STATIC MEMORIES

(75) Inventors: Anand Seshadri, Richardson, TX (US); Hugh Thomas Mair, Fairview, TX (US)

(73) Assignee: Texas Instruments Incorporated, Dallas, TX (US)

( * ) Notice: Subject to any disclaimer, the term of this patent is extended or adjusted under 35 U.S.C. 154(b) by 339 days.

(21) Appl. No.: 12/764,369

(22) Filed: Apr. 21, 2010

(65) Prior Publication Data
US 2011/0261629 A1 Oct. 27, 2011

(51) Int. Cl.
*G11C 5/14* (2006.01)

(52) U.S. Cl. .................... 365/189.09; 365/154; 365/226; 365/227

(58) Field of Classification Search .................. None
See application file for complete search history.

(56) References Cited

U.S. PATENT DOCUMENTS

| | | | |
|---|---|---|---|
| 7,376,038 B2 | 5/2008 | Thiruvengadam et al. | |
| 7,382,674 B2 * | 6/2008 | Hirabayashi | 365/226 |
| 7,385,841 B2 | 6/2008 | Houston | |
| 7,453,743 B2 | 11/2008 | Houston | |
| 7,596,012 B1 | 9/2009 | Su et al. | |
| 7,688,669 B2 * | 3/2010 | McClure et al. | 365/226 |
| 7,715,223 B2 * | 5/2010 | Maeda et al. | 365/154 |
| 7,817,490 B1 * | 10/2010 | Sridhara | 365/227 |
| 2009/0258471 A1 | 10/2009 | Sadra et al. | |

OTHER PUBLICATIONS

Yamaoka et al., "Low-Power Embedded SRAM Modules with Expanded Margins for Writing", Paper No. 26.4, Tech. Digest of Int'l Solid-State Circuits Conference (IEEE, 2005), pp. 480-481, 611.

* cited by examiner

*Primary Examiner* — Tan T. Nguyen
(74) *Attorney, Agent, or Firm* — Rose Alyssa Keagy; Wade J. Brady, III; Frederick J. Telecky, Jr.

(57) ABSTRACT

Bias circuitry for a static random-access memory (SRAM) with a retain-till-accessed (RTA) mode. The memory is constructed of multiple memory array blocks, each including SRAM cells formed of array transistors; functional and other circuitry outside of the array are formed of core transistors, constructed differently from the array transistors. Bias devices are included within each memory array block, the bias devices constructed as one or more array transistors. The bias devices for a memory array block may be connected in parallel with one another. In the RTA mode, the bias devices drop the power supply voltage differential across each of the SRAM cells. In a normal operating mode, a core transistor serves as a switch, shorting out the bias devices so that the full power supply differential appears across the SRAM cells.

24 Claims, 11 Drawing Sheets

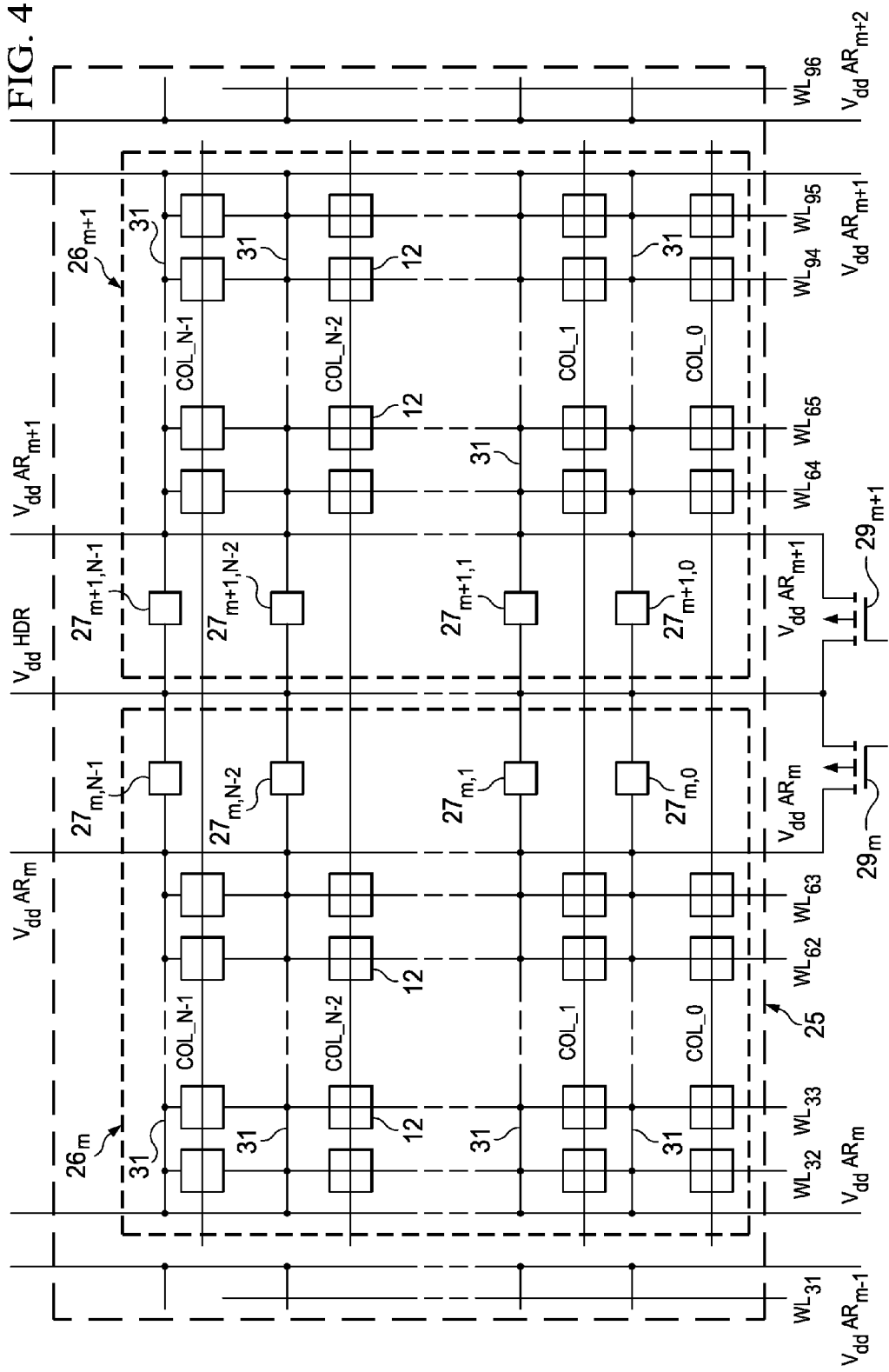

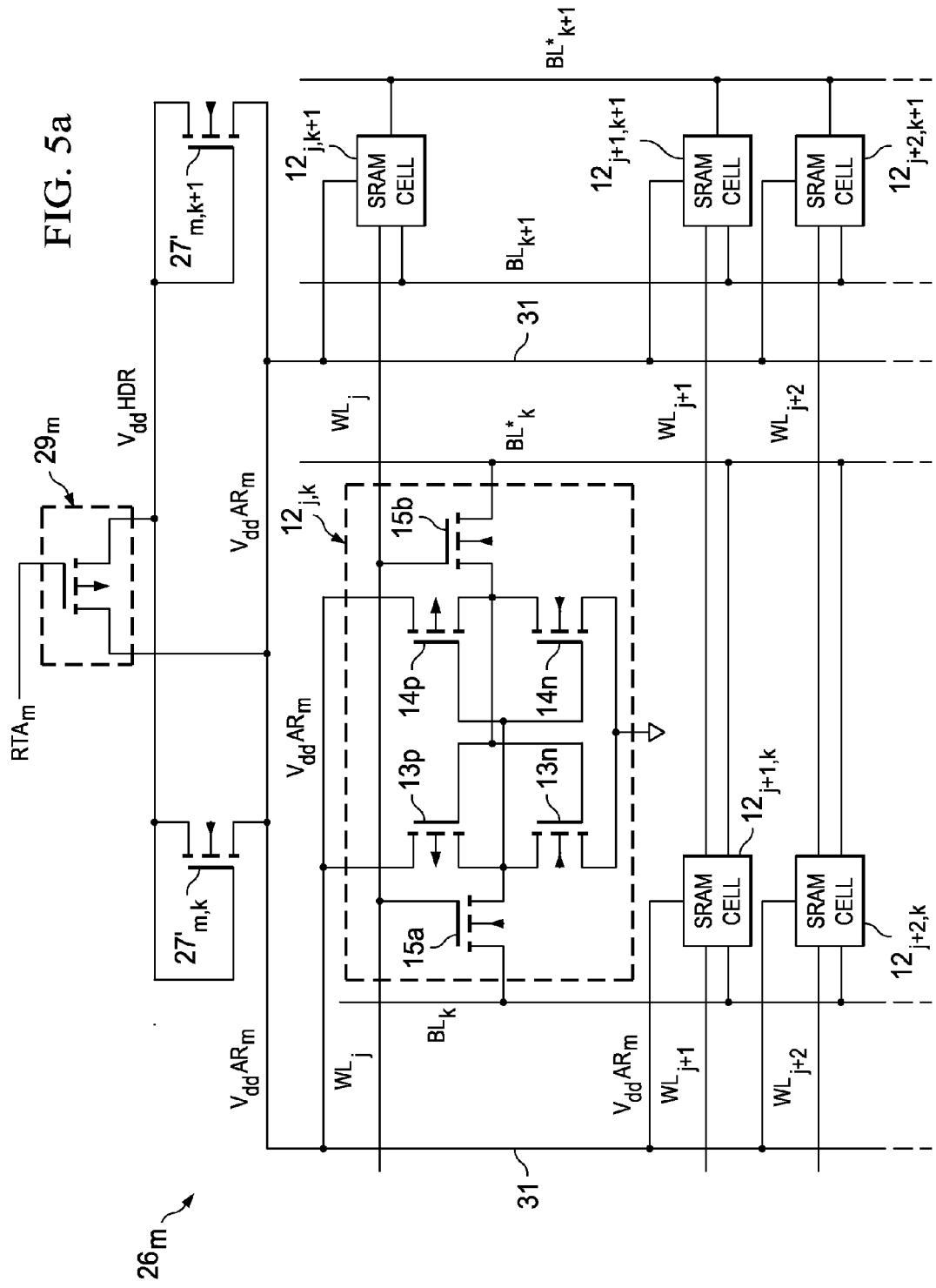

REDUCED POWER CONSUMPTION IN RETAIN-TILL-ACCESSED STATIC MEMORIES

CROSS-REFERENCE TO RELATED APPLICATIONS

This application is related to commonly assigned U.S. patent applications Ser. No. 12/764,399 entitled "Combined Write Assist and Retain-Till-Accessed Memory Array Bias" and Ser. No. 12/764,399 entitled "Retain-Till-Accessed Power Saving Mode in High Performance Static Memories", both filed contemporaneously herewith and incorporated herein by reference.

STATEMENT REGARDING FEDERALLY SPONSORED RESEARCH OR DEVELOPMENT

Not applicable.

BACKGROUND OF THE INVENTION

This invention is in the field of integrated circuits. Embodiments of this invention are more specifically directed to solid-state static random access memories (SRAMs), and power reduction in those SRAMs.

Many modern electronic devices and systems now include substantial computational capability for controlling and managing a wide range of functions and useful applications. Many of these electronic devices and systems are now hand-held portable devices. For example, many mobile devices with significant computational capability are now available in the market, including modern mobile telephone handsets such as those commonly referred to as "smartphones", personal digital assistants (PDAs), mobile Internet devices, tablet-based personal computers, handheld scanners and data collectors, personal navigation devices, and the like. Of course, these systems and devices are battery powered in order to be mobile or handheld. The power consumption of the electronic circuitry in those devices and systems is therefore of great concern, as battery life is often a significant factor in the buying decision as well as in the utility of the device or system.

The computational power of these modern devices and systems is typically provided by one or more processor "cores", which operate as a digital computer in carrying out its functions. As such, these processor cores generally retrieve executable instructions from memory, perform arithmetic and logical operations on digital data that are also retrieved from memory, and store the results of those operations in memory; other input and output functions for acquiring and outputting the data processed by the processor cores are of course also provided. Considering the large amount of digital data often involved in performing the complex functions of these modern devices, significant solid-state memory capacity is now commonly implemented in the electronic circuitry for these systems.

Static random access memory (SRAM) has become the memory technology of choice for much of the solid-state data storage requirements in these modern power-conscious electronic systems. As is fundamental in the art, SRAM memory cells store contents "statically", in that the stored data state remains latched in each cell so long as power is applied to the memory; this is in contrast to "dynamic" RAM ("DRAM"), in which the data are stored as charge on solid-state capacitors, and must be periodically refreshed in order to be retained. However, SRAM cells draw DC current in order to retain their stored state. Especially as the memory sizes (in number of cells) become large, this DC current can become a substantial factor in battery-powered systems such as mobile telephones and the like.

Advances in semiconductor technology in recent years have enabled shrinking of minimum device feature sizes (e.g., MOS transistor gates) into the sub-micron range. This miniaturization is especially beneficial when applied to memory arrays, because of the large proportion of the overall chip area often devoted to on-chip memories. However, this physical scaling of device sizes does not necessarily correlate to similar scaling of device electrical characteristics. In the context of SRAM cells, the memory cell transistors at currently-available minimum feature sizes conduct substantial DC current due to sub-threshold leakage and other short channel effects. As such, the sub-micron devices now used to realize SRAM arrays have increased the DC data retention current drawn by those arrays.

Designers have recently adopted circuit-based approaches for reducing power consumed by integrated circuits including large memory arrays. One common approach is to reduce the power supply voltage applied to memory arrays, relative to the power supply voltage applied to logic circuitry and circuitry peripheral to the memory array (e.g., decoders, sense amplifiers, etc.). This approach not only reduces the power consumed by the memory array, but also helps to reduce sub-threshold leakage in the individual cells.

Another circuit-based approach to reducing power consumption involves placing the memory functions within the integrated circuit into a retention state when possible. In conventional memory retention states, the power supply voltages applied to the memory array are reduced to voltages below that necessary for access, but above the minimum required for data states to be retained in the memory cells (i.e., above the data-state retention voltage, or "DRV"); memory peripheral circuits are also powered down in this full retention mode, saving additional power. Typically, both the "$V_{dd}$" power supply voltage applied to the loads of SRAM cells (e.g., the source nodes of the p-channel transistors in CMOS SRAM cells) and also well bias voltages are reduced in this retention mode. However, significant recovery time is typically involved in biasing the memory array to an operational state from the retention state.

Recently, an intermediate power-down mode has been implemented in integrated circuits with memory arrays of significant size. This intermediate mode is referred to in the art as "retain-till-accessed", or "RTA", and is most often used in those situations in which the memory arrays are split into multiple blocks. In the RTA mode, the peripheral memory circuitry remains fully powered and operational. However, only those block or blocks of the memory array that are being accessed are fully powered; other blocks of the memory that are not being accessed are biased to a reduced array power supply voltage (i.e., above the retention voltage) to reduce power consumption while idle. Well and junction biases (i.e., other than the bias of p-channel MOS source nodes that receive the reduced RTA bias) are typically maintained at the same voltages in RTA mode as in read/write operation, to reduce the recovery time from RTA mode. The power saving provided by the RTA mode can be substantial, especially if some of the larger memory blocks are accessed infrequently. Because of its ability to be applied to individual blocks within a larger-scale integrated circuit, as well as its fast recovery time, the RTA standby mode is now often used with embedded memories in modern mobile Internet devices and smartphones, considering that these devices remain powered-on but not fully active for much of their useful life.

From a circuit standpoint, integrated circuit memories having an RTA mode must include circuitry that establishes the reduced RTA array bias voltage, and that switchably controls entry into and exit from RTA mode during operation. FIG. 1a is a block diagram of a conventional integrated circuit 2 in which such RTA standby is provided. Integrated circuit 2 includes memory array 5, arranged into multiple memory array blocks $6_0$ through $6_3$ of different sizes relative to one another. Each memory array block 6 is associated with corresponding decode and read/write circuitry 11 that addresses, writes data to, and reads data from its associated memory array block 6. Integrated circuit 2 also includes functional and power management circuitry 4, which includes the logic functionality provided by integrated circuit 2, and also circuitry for regulating and distributing power supply voltages throughout integrated circuit 2. For purposes of this example of memory array 5, functional and power management circuitry 4 produces a voltage on power supply line $V_{dd}HDR$ that is sufficient for memory read and write operations. Functional and power management circuitry 4 also produces a "periphery" power supply voltage on power supply line $V_{dd}P$, which is applied to decoder and read/write circuitry 11 and is typically at a different voltage from that of the power supply voltage on line $V_{dd}HDR$ applied to memory array 5 during reads and writes, as known in the art. The actual array power supply voltage applied to each memory array block $6_0$ through $6_3$ is presented on power supply lines $V_{dd}AR_0$ through $V_{dd}AR_3$, respectively. The voltages on lines $V_{dd}AR_0$ through $V_{dd}AR_3$ are defined by way of bias/switch circuits $7_0$ through $7_3$, respectively, and based on the voltage at power supply line $V_{dd}HDR$, as will be described below.

Each memory array block 6 in this conventional integrated circuit 2 is constructed as an array of SRAM cells arranged in rows and columns. As shown in FIG. 1b by the example of six-transistor (6-T) memory cell $12_{j,k}$, which is in the $j^{th}$ row and $k^{th}$ column of one of memory array blocks 6, each SRAM memory cell 12 is biased between the voltage on power supply line $V_{dd}AR$ and a reference voltage (e.g., at ground reference $V_{ss}$). SRAM memory cell $12_{j,k}$ in this case is constructed in the conventional manner as a pair of cross-coupled CMOS inverters, one inverter of series-connected p-channel transistor 13p and n-channel transistor 13n, and the other inverter of series-connected p-channel transistor 14p and n-channel transistor 14n; the gates of the transistors in each inverter are connected together and to the common drain node of the transistors in the other inverter, in the usual manner. N-channel pass transistors 15a, 15b have their source/drain paths connected between one of the cross-coupled nodes and a corresponding one of complementary bit lines $BL_k$, $BL^*_k$, respectively; the gates of pass transistors 15a, 15b are driven by word line $WL_j$ for the row. Accordingly, as known in the art, DC current drawn by SRAM cell $12_{j,k}$ amounts to the sum of the off-state source/drain leakage currents through one of p-channel transistors 13p, 14p and one of re-channel transistors 13n, 14n, plus any gate oxide leakage that may be present. As mentioned above, if transistors 13, 14 are extremely small sub-micron devices, these leakage currents can be significant (as much as 1 nA per memory cell), and can thus result in significant overall standby power consumption if the number of memory cells 12 in memory array blocks 6 is large.

Referring back to FIG. 1a, memory array blocks $6_0$ through $6_3$ may be independently biased into RTA mode in this conventional integrated circuit 2, by operation of bias/switch circuits $7_0$ through $7_3$, respectively. The construction of bias/switch circuit $7_1$ is illustrated in FIG. 1a by way of example. P-channel transistor 8 is connected in diode fashion, with its source at power supply line $V_{dd}HDR$ and its drain and gate connected to node $V_{dd}AR_1$; the voltage drop across transistor 8 from the voltage at line $V_{dd}HDR$ thus establishes voltage on power supply line $V_{dd}AR_1$. Shorting transistor 9 is a relatively large p-channel power transistor with its source/drain path connected between power supply line $V_{dd}HDR$ and power supply line $V_{dd}AR_1$, and its gate receiving control signal $RTA_1$ from functional and power management circuitry 4. If memory array block $6_1$ is being accessed for a read or write operation, control signal $RTA_1$ is driven to a low logic level, which turns on transistor 9 in bias/switch circuit $7_1$ and shorts out diode 8, setting the voltage at line $V_{dd}AR_1$ at that of power supply line $V_{dd}HDR$. Conversely, if memory array block $6_1$ is to be placed in RTA mode, functional and power management circuitry 4 will drive control signal $RTA_1$ to a high logic level. This turns off transistor 9 in bias/switch circuit $7_1$, such that the voltage drop across diode 8 establishes the voltage at node $V_{dd}AR_1$ at a lower voltage (by one diode drop) than the voltage at power supply line $V_{dd}HDR$. In this RTA mode, therefore, the power consumed by memory array block $6_1$ will be reduced by an amount corresponding to at least the square of this voltage reduction. Meanwhile in this RTA mode, periphery power supply line $V_{dd}P$ applied to peripheral memory circuitry, such as decoder and read/write circuitry 11 for each memory array block 6, carries its normal operating voltage, so that this peripheral circuitry is ready to perform an access of its associated memory array block.

It has been observed, in connection with this invention, that it is difficult to optimize the power savings in RTA mode for memory arrays constructed in the conventional fashion. As known in the art, stored data in the SRAM may be lost if the array voltage falls below a minimum data retention bias voltage; conversely, power savings is optimized by biasing the array blocks in RTA mode at a voltage close to that minimum data retention voltage. However, it is difficult to achieve this optimization because of variations in voltage, temperature, and manufacturing parameters; selection of the size and construction of diodes 8 in the example of FIG. 1a to maximize power savings is thus a difficult proposition. In addition, it is now common practice to use different size transistors in the memory cells 12 of memory array blocks 6 of different size; these differences in device sizes create additional difficulty in establishing an optimal RTA array block bias.

It has also been observed, in connection with this invention, that RTA bias optimization is made more difficult by the manner in which conventional integrated circuits with embedded memory arrays are constructed. This conventional construction is shown by way of integrated circuit 2 of FIG. 1a, in which diodes 8 in bias/switch circuits 7 are constructed as part of "core" region 3 including functional and power management circuitry 4. In this core region 3, transistors are constructed substantially differently than the transistors in memory array 5, for example constructed with different channel lengths, different source/drain impurity concentrations via different ion implantation parameters, different gate oxide thicknesses, and the like, relative transistors in SRAM cells 12. For example, according to a conventional 28 nm CMOS manufacturing technology, memory array transistors receive such additional processing as a fluorine implant to increase the effective gate oxide thickness and reduce gate leakage, which the core transistors do not receive; other differences between core and array transistors include different "pocket" implants to implement different threshold voltages for the core and array transistors, and the use of strain engineering techniques to construct the core transistors (e.g., selectively depositing a tensile silicon nitride film over core NMOS transistors and a compressive silicon nitride film over core PMOS transistors) but not to construct the array devices. As described in U.S. Patent Application Publication US 2009/0258471 A1, published Oct. 15, 2009 and entitled "Application of Different Isolation Schemes for Logic and Embedded Memory", commonly assigned with this application and incorporated herein by reference, the isolation structures and isolation doping profiles used in logic core regions of the integrated circuit may differ from those used in the memory arrays, so that tighter isolation spacing can be attained in the memory array. In summary, conventional integrated circuits often include logic core ("core") devices that are constructed to optimize switching performance, while the array devices are constructed for low leakage and low mismatch variation. These differences in construction between transistors in core region 3 and transistors 13, 14 in memory array 5 reduce the ability of diodes 8 to match transistors 13, 14 over variations in process parameters. Additional margin must therefore be provided in selecting the construction of diodes 8 and the resulting voltage drop, to ensure that the minimum data retention voltage is satisfied, but this additional margin necessarily leads to additional standby power consumption.

As mentioned above, it is known in the art to use different size transistors to realize memory cells 12 in memory array blocks 6 of different size. Typically, memory array blocks 6 are grouped according to the number of bits (i.e., number of columns, if a common number of rows per block is enforced), with common transistor sizes based on the group. For example, thirty-two row memory array blocks 6 may be grouped into "bins" of increasing transistor size (W/L): from 16 to 128 columns; from 129 to 256 columns; from 257 to 320 columns, and from 321 to 512 columns. By way of further background, it is also known in the art to provide different size core device diodes 8 for memory array blocks 6 realized by transistors of different sizes. For example, the W/L of p-channel MOS diodes 8 may range from 1.0/0.75 (μm) for memory array blocks 6 of 16 to 128 columns, 1.5/0.045 for memory array blocks 6 of 129 to 256 columns, 2.5/0.045 for memory array blocks 6 of 257 to 320 columns, and 5.0/0.045 for memory array blocks 6 of 321 to 512 columns in size. Even according to this approach, however, it has been observed, in connection with this invention, that a large margin must still be provided for the RTA voltage, because of the wide variation in leakage with variations in power supply voltage, temperature, and process variations, as well as the variation in leakage current drawn with the number of columns in memory array blocks 6 even within a given bin. As such, while this "binning" reduces somewhat the leakage current drawn in the RTA mode, the RTA bias voltage must still be maintained well above the data retention voltage (DRV), and is thus not optimized.

BRIEF SUMMARY OF THE INVENTION

Embodiments of this invention provide a static random access memory (SRAM) in which a reduced array bias is provided in a retain-till-accessed (RTA) in a manner that minimizes power consumption due to cell leakage in the RTA mode.

Embodiments of this invention provide such an SRAM in which one or more devices establishing the RTA mode array bias are constructed in a technology compatible with that used to realize the memory array.

Embodiments of this invention provide such an SRAM that minimizes the chip area penalty for the devices establishing the RTA mode array bias.

Embodiments of this invention provide such an SRAM in which the construction of devices establishing the RTA mode array bias differs from memory cell transistors only at the interconnection level.

Other objects and advantages provided by embodiments of this invention will be apparent to those of ordinary skill in the art having reference to the following specification together with its drawings.

Embodiments of this invention can be realized by constructing a static random access memory (SRAM) array in which a bias device is included in series with the load transistors in each memory cell of a given column or columns, where the bias device is constructed of a size and technology similar to that of the memory array transistors. The bias device drops the power supply voltage applied to the memory cells in a reduced power mode, such as retain-till-accessed (RTA) mode. One bias device may be provided for each column, or shared among a small number of columns.

The bias devices may be realized in various forms. Some embodiments realize the bias devices in the form of a diode in series with the load devices in the memory cells in one or a few columns, where the bias devices are constructed similarly as the memory cell transistors. Other embodiments include stacked pairs of transistors, especially in operating from an elevated power supply voltage. Source follower arrangements can also be used to implement embodiments of the invention.

BRIEF DESCRIPTION OF THE SEVERAL VIEWS OF THE DRAWING

FIG. 1b is an electrical diagram, in schematic form, of a memory cell in the conventional integrated circuit of FIG. 1a.

FIG. 4 is a schematic diagram illustrating, in plan view, a layout of a memory array constructed according to embodiments of this invention.

FIGS. 5a through 5f are electrical diagrams, in schematic form, of the implementation of bias devices according to embodiments of this invention.

DETAILED DESCRIPTION OF THE INVENTION

The present invention will be described in connection with its preferred embodiment, namely as implemented into an integrated circuit including an embedded memory array, and constructed according to complementary metal-oxide-semiconductor (CMOS) technology. However, it is contemplated that the benefits of this invention may be attained when realized in other applications and constructed according to other technologies. Accordingly, it is to be understood that the following description is provided by way of example only, and is not intended to limit the true scope of this invention as claimed.

Figure 2:
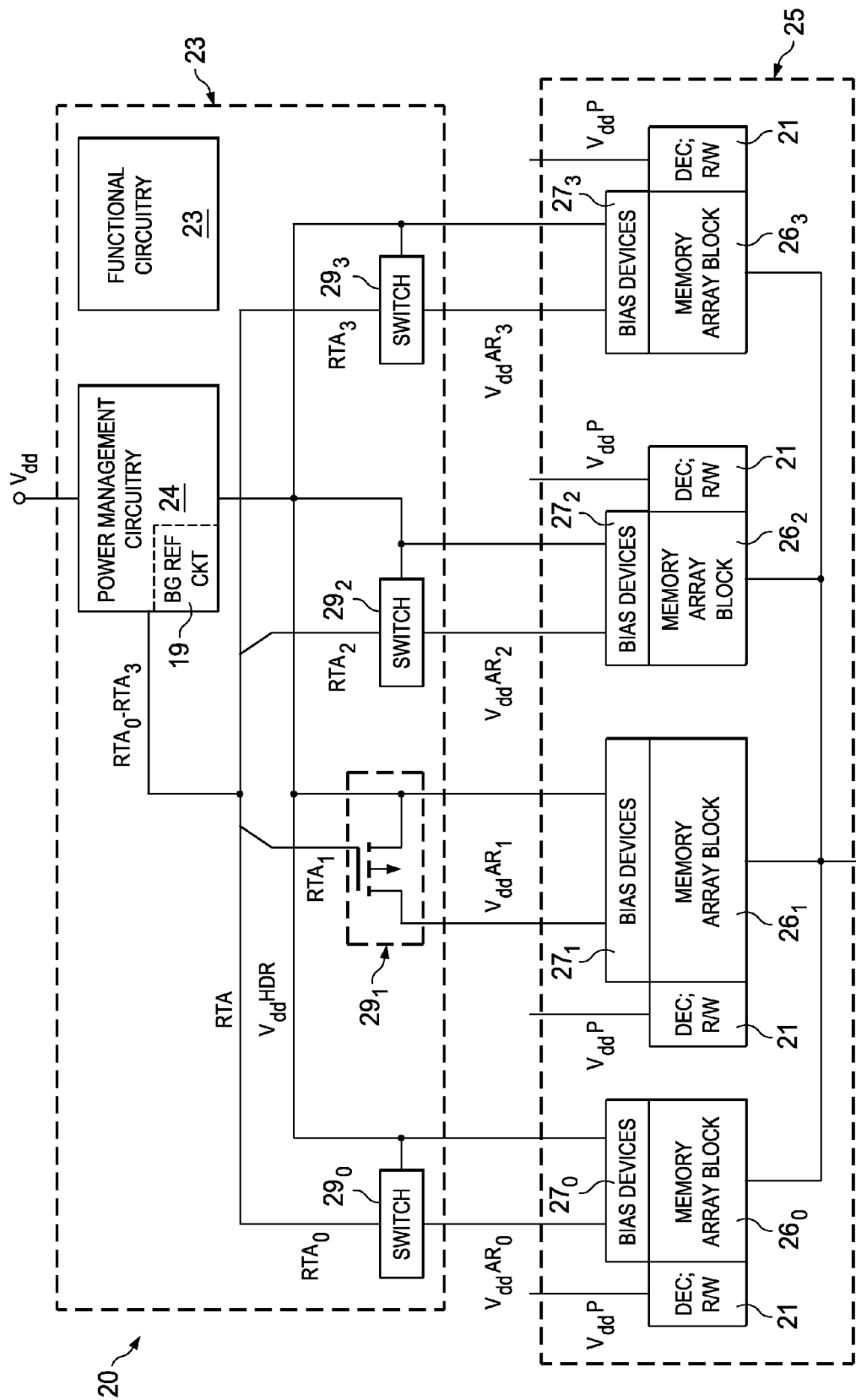
FIG. 2 is an electrical diagram, in block form, of an integrated circuit including a memory array constructed according to embodiments of this invention.

Referring now to FIG. 2, by way of example, integrated circuit 20 constructed according to embodiments of this invention will now be described at a block diagram level. As shown in FIG. 2, integrated circuit 20 includes functional circuitry 23, power management circuitry 24, and memory array 25. The functionality provided by functional circuitry 23 may vary widely depending on the desired application. For example, if integrated circuit 20 is a large-scale device such as a "system on a chip", functional circuitry 23 may correspond to programmable logic circuitry such as a microprocessor or digital signal processor core, along with the corresponding support and interface circuitry of which memory array 25 and its peripheral circuitry would serve as an embedded memory resource; at another extreme, integrated circuit 20 may be a stand-alone memory device, in which case functional circuitry 23 would provide the support and interface circuitry for accessing memory array 25. As such, in embodiments of this invention, the construction and capability of functional circuitry 23 can correspond to any of a wide array of possibilities.

According to embodiments of this invention, memory array 25 is arranged as multiple memory array blocks $26_0$ through $26_3$. In this example, memory array blocks $26_0$ through $26_3$ are of different sizes relative to one another, but of course need not be. While four memory array blocks $26_0$ through $26_3$ are shown, memory array 25 may be realized by as few as one memory block 26, or by more than four memory array blocks $26_0$ through $26_3$, depending on the particular application. Each memory array block 26 is associated with corresponding decode and read/write circuitry 21, which is involved in the addressing of memory cells in its associated memory array block 26, including the reading and writing of stored contents.

Power management circuitry 24 regulates and distributes power supply voltages throughout integrated circuit 20. According to embodiments of this invention, power management circuitry 24 applies, to power supply line $V_{dd}HDR$, a power supply voltage sufficient to enable read and write operations to memory cells within memory array blocks 26. Power management circuitry 24 also produces and controls other power supply voltages, including that applied to periphery power supply line $V_{dd}P$ for biasing decoder and read/write circuitry 11, and also the appropriate power supply voltages applied to functional circuitry 23 and to power management circuitry 24 itself. Typically, power management circuitry 24 generates these power supply voltages, including power supply voltages on lines $V_{dd}HDR$, $V_{dd}P$, and others, from an external power supply voltage, which in this case is shown in FIG. 2 by external power supply terminal $V_{dd}$. Power management circuitry 24 may also include charge pump circuits or other functions that provide negative or other reference bias voltages, for example as applied to wells or substrate connections within integrated circuit 20, as conventional in the art.

In connection with the operation of memory array 25, according to embodiments of this invention, memory array blocks $26_0$ through $26_3$ are associated with corresponding sets of bias devices $27_0$ through $27_3$, respectively. Bias devices $27_0$ through $27_3$ each receive power supply line $V_{dd}HDR$ from power management circuitry 24. As will be described in further detail below, bias devices $27_0$ through $27_3$ generate corresponding power supply voltages on lines $V_{dd}AR_0$ through $V_{dd}AR_3$, respectively, based on the voltage on power supply line $V_{dd}HDR$. A connection between each power supply line $V_{dd}AR_0$ through $V_{dd}AR_3$ and its respective switch $29_0$ through $29_3$ is also made. As shown by way of example, according to embodiments of this invention, switch $29_1$ is constructed as a p-channel MOS transistor with its source/drain path connected between its corresponding power supply line $V_{dd}AR_1$ and power supply line $V_{dd}HDR$, and its gate is driven by control signal $RTA_1$ generated by power management circuitry 24. Switches $29_0$, $29_2$, $29_3$ are similarly constructed and connected in the same manner. Of course, switches 29 may be constructed according to any other suitable device type or structure, depending on the desired manner in which its function described below is to be carried out. It is contemplated that these switches 29 will be realized by relatively large transistors, as compared with the transistors realizing the memory cells in memory array blocks 26.

Figure 1A:
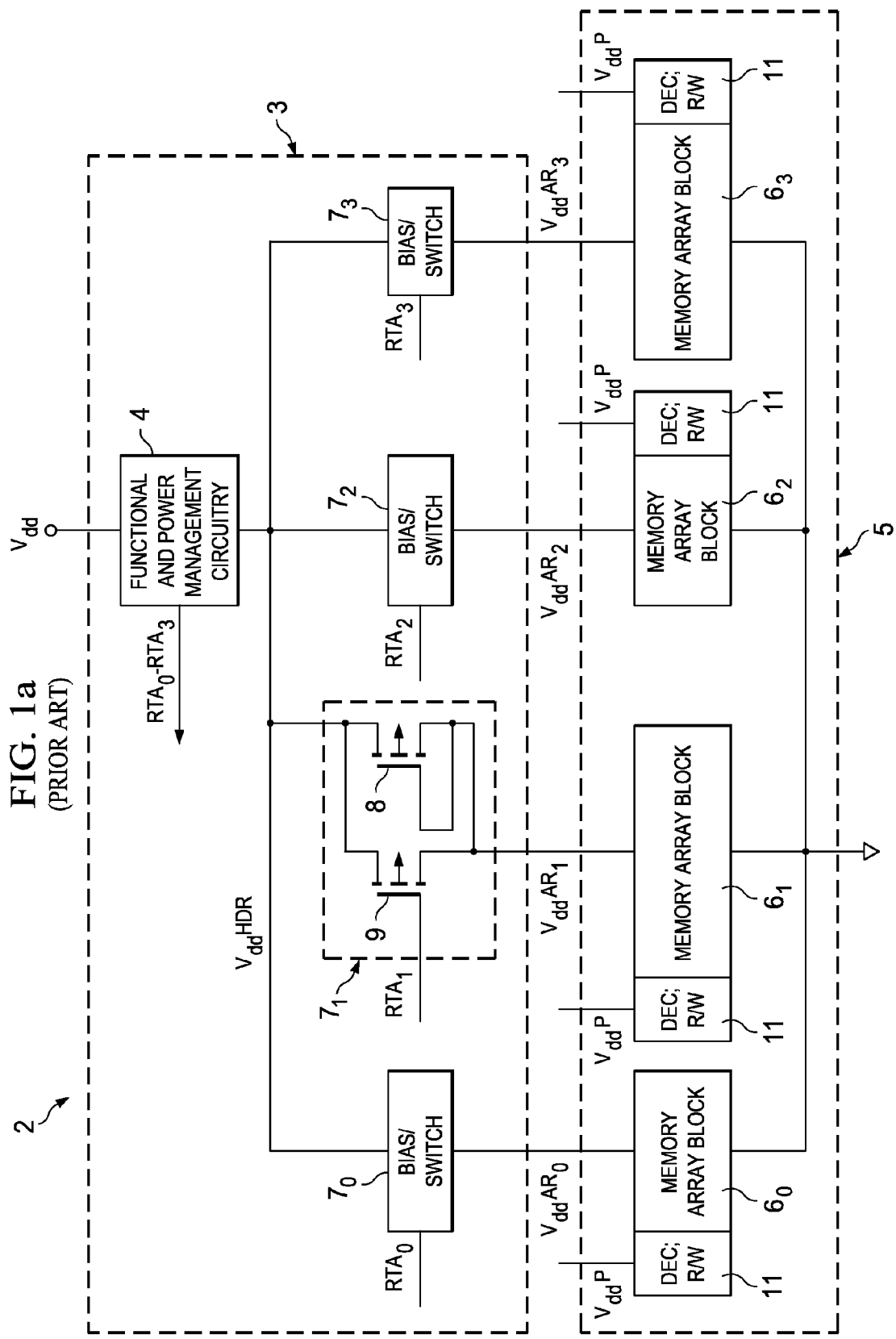
FIG. 1a is an electrical diagram, in block form, of a conventional integrated circuit including a memory array.
Figure 1B:
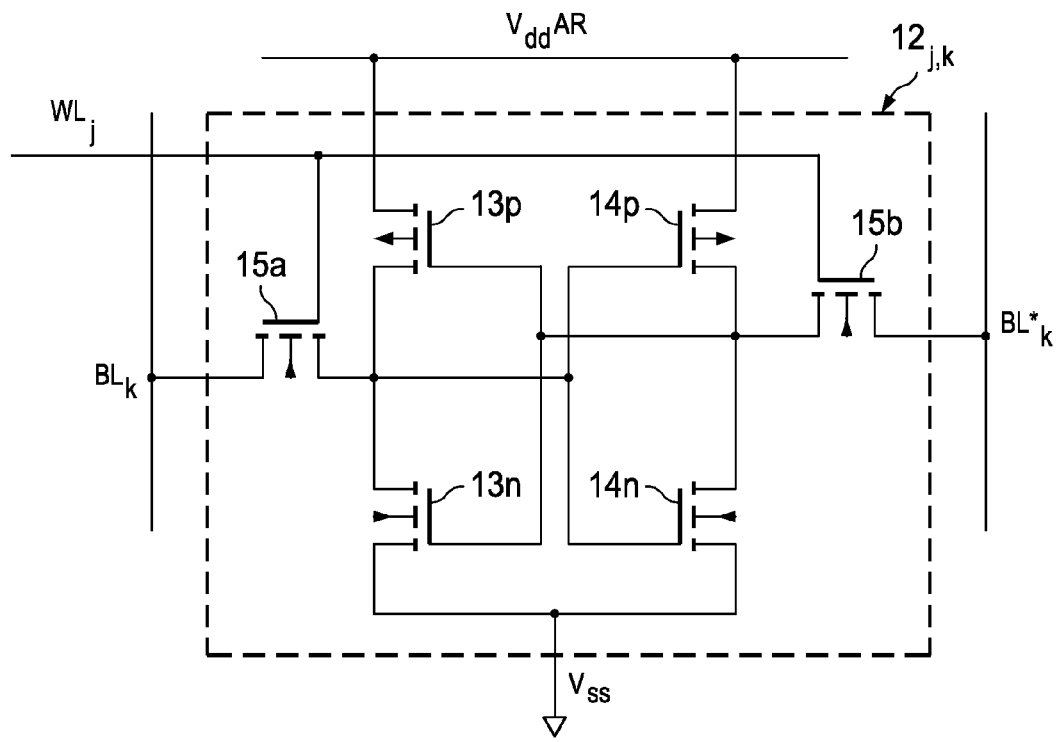

According to embodiments of this invention, memory array blocks 26 are each constructed as conventional CMOS static random access memory (RAM) memory cells, arranged in rows and columns. These memory cells may be constructed as conventional 6-T CMOS SRAM cells, as described above in connection with FIG. 1b. Alternatively, the memory cells of memory array blocks 26 may be more complex 8-T CMOS SRAM cells in which separate read and write paths are provided, or constructed according to other conventional SRAM techniques, including those with passive load devices. In any event, it is contemplated that the memory cells realizing memory array blocks 26 will consume some level of DC current, for example to ground from a positive power supply voltage on power supply line $V_{dd}HDR$ or $V_{dd}AR$, as the case may be, in retaining their stored data states.

According to modern CMOS technologies, the types of transistors used to realize memory array 25 can differ dramatically from those used elsewhere in integrated circuit 20. For example, the "array" type of transistors used to realize memory array 25 can be of minimum feature size (i.e., channel length), and fabricated in a different manner than the "core" transistors used to realize logic and power management functionality, to minimize the chip area required for memory array 25 while maintaining high performance devices in the core and periphery. In contrast, core transistors are fabricated to maximize switching performance, typically at a cost of increased chip area and process complexity. For example, to minimize gate leakage, memory array 25 transistors can receive an additional fluorine implant to increase the effective gate oxide thickness (e.g., by about 1 Å), while core region 23 transistors do not receive such an implant. Conversely, to improve performance, core region 23 transistors can be fabricated using conventional strain engineering techniques (e.g., selectively depositing a tensile silicon nitride film over core NMOS transistors and a compressive silicon nitride film over core PMOS transistors), while memory array 25 transistors do not receive such processing. The core and array transistors may also have significant differences in "pocket" implants that result in different threshold voltages relative to one another. As described in U.S. Patent Application Publication US 2009/0258471 A1, published Oct. 15, 2009 and entitled "Application of Different Isolation Schemes for Logic and Embedded Memory", commonly assigned with this application and incorporated herein by reference, the isolation structures and isolation doping profiles used in core region 23 can differ from those used in the memory arrays, so that tighter isolation spacing and thus higher device density can be attained in memory array 25. As evident from this description to those skilled in the art, these processing differences of transistors in core region 23 relative to transistors in memory array 25 involve structures that are relatively early in the manufacturing process (i.e., "base level" differences), rather than at the higher levels such as interconnections and metal conductor routing. As such, substantial chip area penalty would be involved if one were to construct a core transistor physically within memory array 25. According to embodiments of this invention, memory array blocks 26 are realized within areas of integrated circuit 20 realized by array transistors and not core transistors; conversely, the transistors of core region 23 are formed in areas away from memory array blocks 26. Memory periphery functions such as decoder and read/write circuitry 21 can be constructed as core devices, for example in areas of integrated circuit 20 near or adjacent to, but outside of, corresponding memory array blocks 26.

While memory array blocks 26 in memory array region 25 are all constructed of array transistors, as described above, it is contemplated that the transistor sizes of the array transistors for memory cells within memory array blocks 26 may vary from block to block, particularly if the memory sizes (i.e., number of rows and/or columns) vary from block-to-block. In that event, the transistor sizes of bias devices 27 will similarly vary from block to block, to optimize device matching.

According to embodiments of this invention, each memory array block 26 in memory array 25 is capable of operating in a retain-till-accessed (RTA) mode, in which the power supply voltage biasing each memory cell is reduced to a level above the data retention voltage (DRV), but in which its associated peripheral circuitry such as decoder and read/write circuitry 21 remains fully biased. As will be described below, each switch $29_m$ serves to short its power supply line $V_{dd}AR_m$ to power supply line $V_{dd}HDR$ during such time as power management circuitry 24 determines that its memory array block $26_m$ is not in RTA mode (i.e., its control signal $RTA_m$ is active low). Conversely, if a memory array block $26_m$ is in RTA mode, its switch $29_m$ is open, permitting its bias devices $27_m$ to establish a power supply voltage on line $V_{dd}AR$ that is below the power supply voltage at line $V_{dd}HDR$, thus reducing the power consumed by memory array block $26_m$.

As will be evident from the following description, the arrangement of integrated circuit 20 shown in FIG. 2 provides important advantages in optimizing the power reduction available in RTA mode. These advantages include the ability to better match bias devices 27 to the corresponding memory array blocks 26, including better matching of the construction of bias devices 27 to the transistors used to realize memory cells in memory array blocks 26, especially if the transistor sizes among the various memory array blocks 26 varies from block-to-block. This improved matching enables the RTA bias level to be set closer to the DRV for the specific construction of the memory cells in each block, without risking data loss. In addition, according to some embodiments of the invention, the matching and margin of the voltage drop in RTA mode is facilitated by construction of bias devices 27 as array devices, rather than as core devices; in some embodiments of the invention, this construction is attained with minimal chip area penalty. These and other advantages of this invention will become apparent from the following description.

The construction and operation of bias devices $27_m$ according to an embodiment of the invention will now be described with reference to FIG. 3a. In this embodiment of the invention, SRAM cells 12 are constructed according to the conventional 6-T approach described above relative to FIG. 1b; the same reference numerals are used for components of SRAM cell $12_{j,k}$ of FIG. 3a as used in FIG. 1b, and as such the construction of SRAM cell $12_{j,k}$ will not be further described. In the portion of memory array block $26_m$ of FIG. 3a, SRAM cells 12 in two columns k, k+1, and three rows j, j+1, j+2 are illustrated by way of example, it being understood that memory array block $26_m$ will likely include many more cells 12 in more columns and rows. For example, memory array blocks $26_0$ through $26_3$ may each have on the order of sixteen to sixty-four rows, and columns numbering from as few as sixteen columns to as many as 512 columns or more. SRAM cells 12 in the same row share the same word line (e.g., SRAM cells $12_{j,k}$ and $12_{j,k+1}$ each receive word line $WL_j$), and SRAM cells in the same column are coupled to the same bit line pair (e.g., SRAM cells $12_{j,k}$, $12_{j+1,k}$, $12_{j+2,k}$ are each connected to bit lines $BL_k$, $BL^*_k$).

In this embodiment of the invention, each column of SRAM cells 12 in memory array block $26_m$ is associated with an instance of a bias device $27_m$. More specifically, SRAM cells 12 that are associated with bit lines $BL_k$, $BL^*_k$ (i.e., SRAM cells 12 in column k) are associated with bias device $27_{m,k}$; similarly, SRAM cells 12 in column k+1 are associated with bias device $27_{m,k+1}$. In this specific example, the number of bias devices $27_m$ associated with memory array block $26_m$ equals the number of columns of SRAM cells 12 in memory array block $26_m$. In a more general sense, it is contemplated that the overall size of bias devices $27_m$, considered in the aggregate, will tend to be proportional to the number of columns in its associated memory array block $26_m$, within integrated circuit 20.

In this embodiment of the invention, each bias device $27_m$ is constructed as a p-channel MOS (i.e., PMOS) transistor, with its drain and gate nodes connected to power supply line $V_{dd}AR_m$ and its source node connected to power supply line $V_{dd}HDR$.

As such, bias devices $27_m$ operate as MOS diodes, in this embodiment of the invention. Also according to this invention, each bias device $27_m$ is constructed as an "array" transistor, fabricated by the same process steps and process parameters as used to fabricate p-channel transistors 13p, 14p in each of SRAM cells 12. This enables bias devices $27_m$ to be physically located within the area of memory array block $26_m$.

As known in the art, modern memory arrays constructed with extremely small (sub-micron) device sizes are best realized by regular and periodic bit cell structures, to avoid proximity effects in photolithographic patterning and asymmetric transistor strain. For example, as known in the art, many memory arrays are constructed to have "dummy" cell structures at their edges, such dummy cells effectively serving as a sacrificial row or column of structures that enable the interior bit cell structures to be free from such proximity effects. In order to most efficiently place bias devices $27_m$ within the area of memory array block $26_m$, therefore, the physical feature sizes (i.e., channel width and length) of the one or more transistors realizing each bias devices $27_m$ are intended to be about the same as the feature sizes of SRAM cells 12. Some variation in feature sizes (i.e., channel width or channel length) may be tolerable, without requiring the insertion of "dummy" devices to absorb proximity effects. In any event, it is preferable to ensure that any such variations do not destroy the periodicity of layout within memory array block $26_m$, so that "live" SRAM cell structures can be placed adjacent to bias devices $27_m$ as will be discussed below.

The drive of bias devices $27_m$, considered in the aggregate, is preferably selected to define the desired voltage drop from power supply line $V_{dd}HDR$ to power supply line $V_{dd}AR_m$ for the expected leakage current drawn by memory array block $26_m$. As known in the art, the voltage drop across a forward biased diode depends on the diode threshold voltage, and also on the current drawn through the diode; in general, the voltage drop across a diode of a given current capacity (W/L ratio) will increase with increasing current. Accordingly, the voltage drop between power supply line $V_{dd}HDR$ and power supply line $V_{dd}AR_m$, for a given current drawn by cells 12 in memory array block $26_m$, will depend on the aggregate size of bias devices $27_m$. Considering, as described above, that the feature sizes of bias devices $27_m$ preferably match the transistor sizes in SRAM cells 12, the desired voltage drop can be implemented by determining the number of parallel-connected bias devices $27_m$ implemented to source the expected leakage current of memory array block $26_m$.

Also in this embodiment of the invention, power supply line $V_{dd}AR_m$ is connected to the drain and gate nodes of all bias devices $27_m$ associated with memory array block $26_m$. In effect, therefore, each bias device $27_m$ is connected as a p-channel MOS diode with its anode at power supply line $V_{dd}HDR$ and its cathode at power supply line $V_{dd}AR_m$, with multiple bias devices $27_m$ connected in parallel with one another between those two nodes; all bias devices $27_m$ may be connected in parallel in this fashion, or bias devices $27_m$ may be grouped into a few groups, connected in parallel within each group. Each SRAM cell 12 receives the voltage at line $V_{dd}AR_m$, as communicated from parallel-connected bias devices $27_m$ for memory cell array $26_m$, and communicated to SRAM cells 12 via conductors 31. This parallel connection essentially establishes the voltage drop from power supply line $V_{dd}HDR$ to power supply line $V_{dd}AR_m$ as an average of the diode drops across the parallel-connected bias devices $27_m$. This parallel connection provides the advantage of a more robust and well-defined power supply voltage on line $V_{dd}AR_m$, with reduced vulnerability to defects in a single one of bias devices $27_m$, and better tolerance to device mismatches caused by fabrication. Alternatively, these bias devices $27_m$ may not be connected in parallel with one another but may instead bias only a single column, for example if a "write assist" architecture is implemented as described in copending and commonly assigned U.S. patent application Ser. No. 12/764,399 entitled "Combined Write Assist and Retain-Till-Accessed Memory Array Bias", filed contemporaneously herewith and incorporated herein by reference.

Figure 3A:
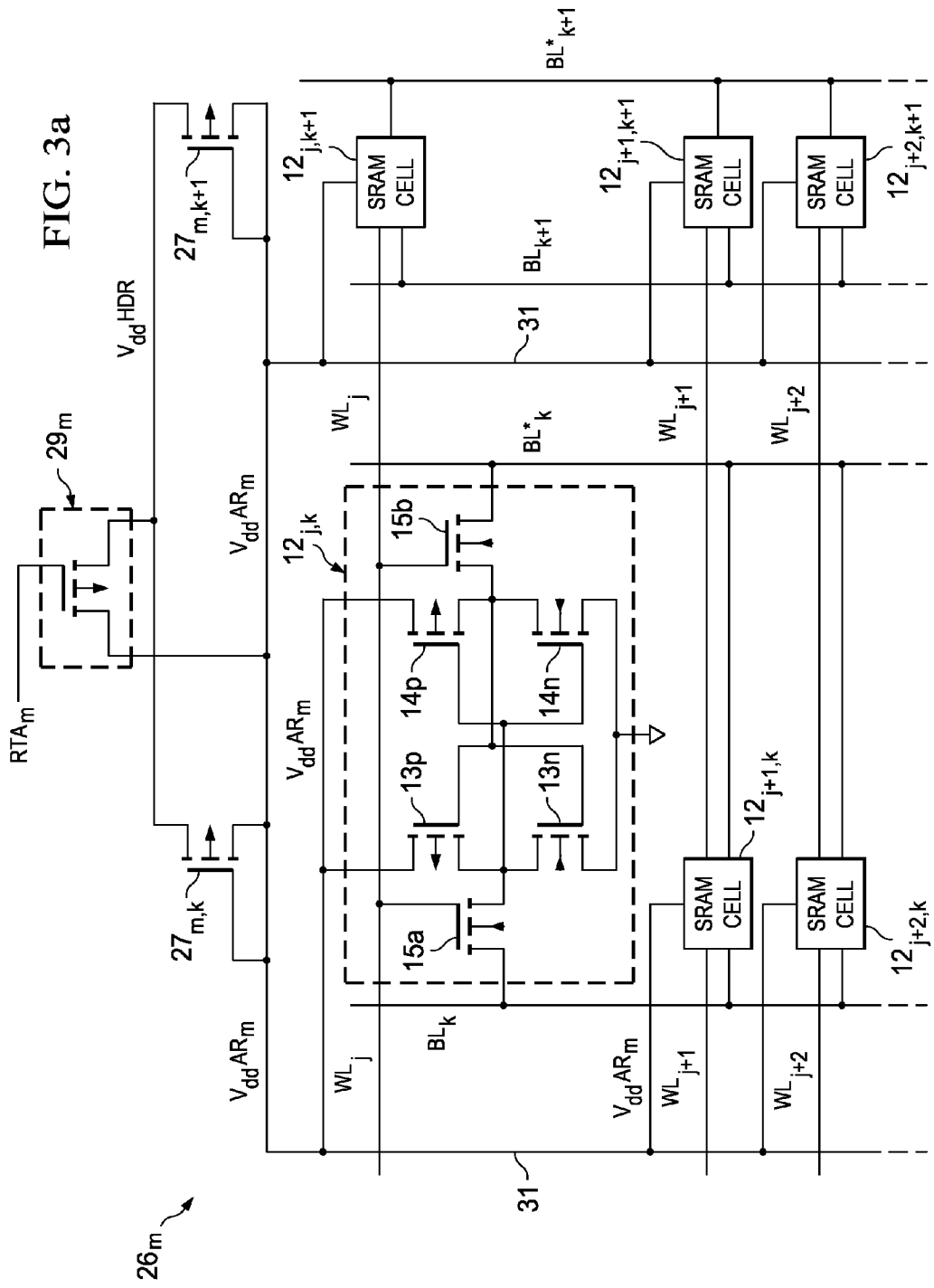
FIGS. 3a and 3b are electrical diagrams, in schematic form, of the implementation of bias devices according to first and second embodiments of this invention.

The connection of switch device $29_m$ is illustrated in FIG. 3a. As described above, switch device $29_m$ is a "core" transistor of relatively large drive capacity in this embodiment of the invention, and as such is disposed outside of the chip area used to realize memory array block $26_m$. When turned on by control signal $RTA_m$ in its inactive low state indicating a normal operational mode, switch $29_m$ shorts power supply line $V_{dd}AR_m$ to power supply line $V_{dd}HDR$, in which case SRAM cells 12 in memory array block $26_m$ are biased by the normal operating power supply voltage $V_{dd}HDR$.

In the RTA mode for memory array block $26_m$, switch $29_m$ is turned off ($RTA_m$ active high), permitting the parallel-connected PMOS "header" bias devices $27_m$ to establish the power supply voltage on line $V_{dd}AR_m$ as described above. In this RTA mode, therefore, the power consumed by memory array block $26_m$ is reduced by an amount corresponding to at least the square of this voltage reduction. And because bias devices $27_m$ are constructed as array devices, the matching of bias devices $27_m$ to SRAM cells 12 of associated memory array block $26_m$ is much improved over conventional approaches in which the header diode is a core device. This improved matching allows the power supply voltage on line $V_{dd}AR_m$ to be lowered more aggressively in RTA mode, closer to the data retention voltage of memory array block $26_m$, optimizing RTA mode power savings.

Figure 3B:
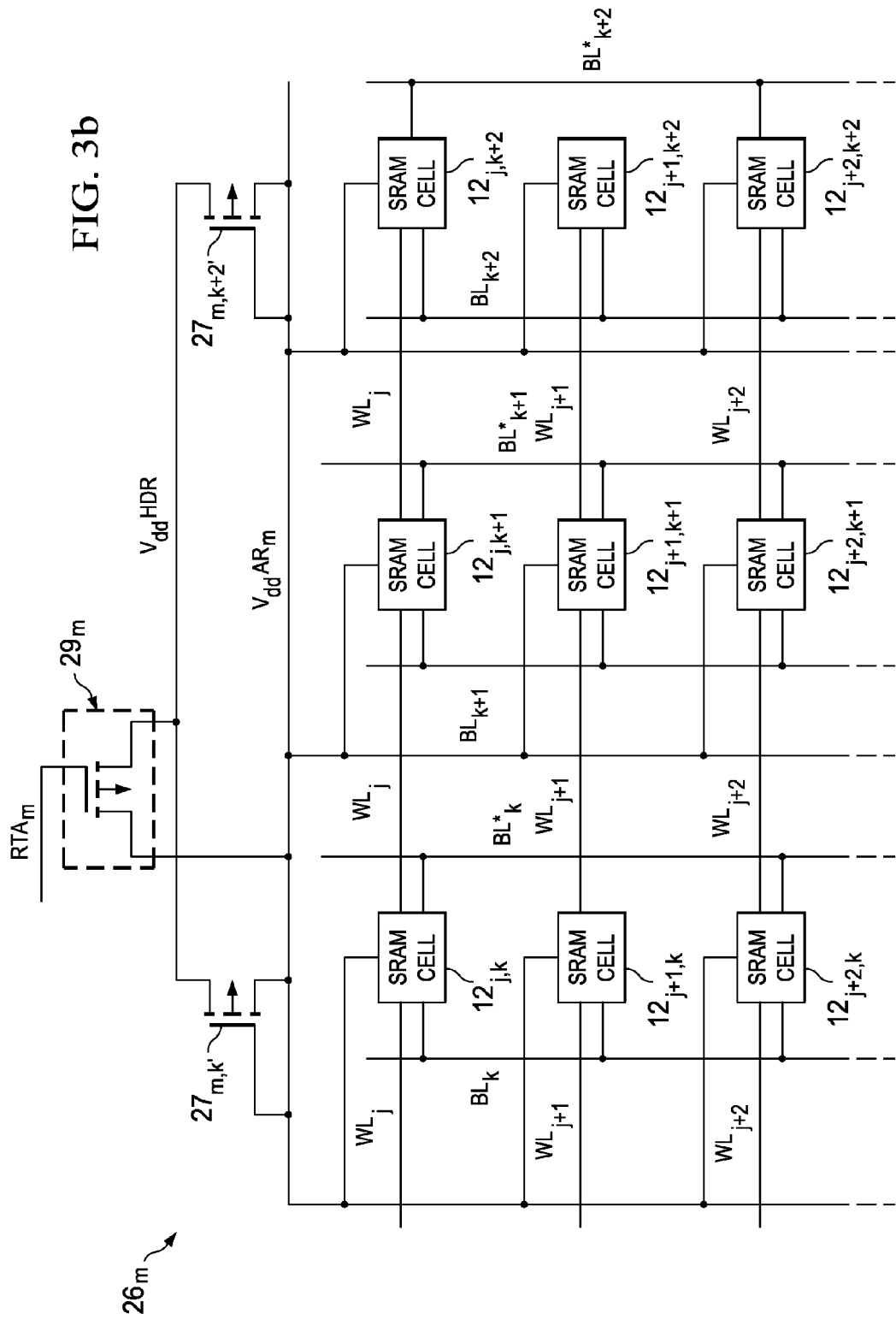

FIG. 3b illustrates an alternative realization of this embodiment of the invention, in connection with array portion $26_m$. The construction of array portion $26_m$ is essentially identical with that shown in FIG. 3a, with the exception that multiple columns share a single PMOS header bias device $27_m$. In the realization of FIG. 3b, one bias device $27_m$ is provided for every two columns of SRAM cells 12. For example, as shown in FIG. 3b, SRAM cells 12 in columns k and k+1 are associated with bias device $27_{m,k'}$, while the next pair of columns beginning with column k+2 are associated with bias device $27_{m,k+2}$. In this realization, all bias devices $27_m$ are connected in parallel between power supply line $V_{dd}AR_m$ and power supply line $V_{dd}HDR$, to provide the smoothing of mismatch and other variations mentioned above. In this case, the number of bias devices $27_m$ connected in parallel in this manner (i.e., the number of bias devices $27_m$ relative to the number of columns in memory array block $26_m$) can be selected so as to define the desired voltage drop between power supply line $V_{dd}AR_m$ and power supply line $V_{dd}HDR$; from a layout standpoint, this selection may be accomplished as simply as placing or removing contacts or vias in a single mask level. Alternatively, these bias devices $27_m$ may be separated from one another if desired for other circuit functions such as write assist.

As described above, bias devices 27 can be realized and fabricated in the form of "array" transistors rather than in the form of "core" transistors used to realize functional circuitry 23, power management circuitry 24, and switches 29. And because bias devices 27 are fabricated according to the same fabrication steps as the transistors within SRAM cells 12, bias devices $27_m$ can be physically placed within its associated memory array block $26_m$. Furthermore, also as described above, the physical layout of bias devices $27_m$ within its associated memory array block $26_m$ is most efficient if the feature sizes of bias devices $27_m$ are the same as the feature sizes of transistors within SRAM cells 12, so that imbalance in device structure or performance due to proximity effects (and thus the need for "dummy" cells placed between bias devices $27_m$ and adjacent "live" SRAM cells 12) are avoided. It may be possible to vary the feature sizes of bias devices $27_m$ from those in SRAM cells 12 in order to tune the voltage drop, without necessitating the placement of dummy cells, but the extent to which these features vary will depend on the sensitivity of the cell transistors to such proximity effects.

An example of the layout of bias devices $27_m$ will now be described in connection with FIG. 4. The layout of FIG. 4 schematically illustrates, in plan view, a portion of an integrated circuit, including memory array region 25 in which bias devices $27_m$, $27_{m+1}$ are physically located within the area of their respective memory array blocks $26_m$, $26_{m+1}$. As fundamental in the art, this plan view is of an integrated circuit formed at and into a surface of a semiconductor "chip", for example at a surface of a semiconductor substrate, or of a semiconductor layer overlying an insulating substrate (e.g., in the well-known silicon-on-insulator, or "SOI", technology), or the like. Additional conductor and insulator layers may, of course, overlie the structures that are schematically illustrated in FIG. 4; those skilled in the art having reference to this specification will of course readily comprehend the correspondence between the layout of FIG. 4 and an actual integrated circuit. The arrangement of this FIG. 4 corresponds to the schematic representation of FIG. 3a, in which each column is associated with one bias device 27. Of course, the sharing arrangement of FIG. 3b can also readily be realized by simple modifications to this layout of FIG. 4. In the example of FIG. 4, word lines $WL_x$ run vertically (as exemplified by word lines $WL_{32}$, $WL_{33}$, etc.) and columns COLx run horizontally (as exemplified by bit lines COL0, COL1, COL N-1, et$_c$.). SRAM cells 12 are located at the intersection of the various wordlines $WL_x$ and bit lines COL0, COL1, COL N-1. Also as shown in FIG. 4, each column is associated with an instance of bias lines 31.

In this example, each memory array block 26 includes thirty-two rows of SRAM cells 12 and thus thirty-two word lines $WL_x$; the number of columns within each memory array block 26 may vary from block to block, ranging from as few as sixteen to as many as 512 columns in modern embedded SRAM memories. For example, memory array block $26_m$ includes SRAM cells 12 in rows 32 to 63 (word lines $WL_{32}$ through $WL_{63}$), and memory array block $26_{m+1}$ includes SRAM cells 12 in rows 64 to 95 (word lines $WL_{64}$ through $WL_{95}$). Other memory array blocks 26 are implemented in memory array 25, as evident by the word lines $WL_{31}$, $WL_{96}$, on either side of memory array blocks $26_m$, $26_{m+1}$.

By way of example, each of memory array blocks $26_m$, $26_{m+1}$ includes, within its physical area, its associated bias devices $27_m$, $27_{m+1}$, respectively. In the layout of FIG. 4a, power supply line $V_{dd}HDR$ corresponds to a conductor that runs vertically between memory array blocks $26_m$ and $26_{m+1}$. For memory array block $26_m$, bias devices $27_{m,0}$ through $27_{m,N-1}$ are provided, one for each of the N columns in memory array block $26_m$. Each bias device $27_{m,0}$ through $27_{m,N-1}$ is connected between power supply line $V_{dd}HDR$ and power supply line $V_{dd}AR_m$, with power supply line $V_{dd}AR_m$ connecting bias devices $27_{m,0}$ through $27_{m,N-1}$ in parallel with one another. Power supply line $V_{dd}AR_m$ is also connected to each of column bias lines 31, by way of which the array power supply bias voltage is communicated to cells 12. Power supply lines $V_{dd}AR_m$ are provided on both sides of memory array block $26_m$, in the example of FIG. 4, connecting to each end of each bias line 31.

Also as shown in FIG. 4, switches 29 are provided for each memory array block 26, at a location outside of memory array region 25. In this example, switch $29_m$ is a relatively large p-channel MOS transistor with its source-drain path connected between power supply line $V_{dd}HDR$ and power supply line $V_{dd}AR_m$, and switch $29_{m+1}$ is a relatively large p-channel MOS transistor with its source-drain path connected between power supply line $V_{dd}HDR$ and power supply line $V_{dd}AR_{m+1}$. The gates of switches $29_m$, $29_{m+1}$ are controlled by power management circuitry 24 (FIG. 2), as described above. Switches 29 are preferably large devices so as to provide large drive capacity and thus minimize recovery time from RTA mode to normal operation. The placement of switches 29 outside of memory array region 25 not only avoids disruption of the memory array layout and regularity and thus chip area from these large devices, but also enables construction of these switches 29 as core devices, constructed differently from bias devices 27 and the transistors of SRAM cells 12 in the manner described above.

It has been observed that the chip area required for realization of bias devices 27 within their respective memory array blocks 26 is relatively modest. Because bias devices 27 are constructed as array transistors (rather than as core transistors, in the conventional manner), their construction within memory array region 25 can be accomplished by relatively simple means, accomplished by photomask patterns, and often only at "higher" levels (contact or metal, or both). This enables efficient placement of bias devices 27 within memory array region 25. For example, it has been observed that realization of bias devices 27 occupies an additional chip area of about ½ of a row of SRAM cells 12 (i.e., about an additional 1.5% of the total chip area of a thirty-two row memory array block), relative to the chip area overhead required in conventional RTA bias devices for splitting the power supply conductor (e.g., splitting a single $V_{dd}$ line into $V_{dd}AR_x$ and $V_{dd}AR_{x+1}$ lines as in FIG. 1a). It is contemplated that, in most cases, this chip area cost is tolerable in order to attain the resulting reduction in RTA-mode power consumption.

It is further contemplated that one skilled in the art, having reference to this specification, will be readily able to realize and layout bias devices 27 in an efficient manner for a particular implementation, in a manner compatible with the construction of corresponding SRAM cells 12.

Various alternatives to the construction and realization of bias device 27 will be apparent to those skilled in the art having reference to this specification. One such alternative is illustrated in FIG. 5a. In this alternative embodiment of the invention, bias devices $27'_{m,k}$, $27'_{m,k+1}$ are constructed as n-channel MOS transistors, each associated with a corresponding column (columns k, k+1, respectively) of SRAM cells 12 in memory array block $26_m$. Bias devices $27'_{m,k}$, $27'_{m,k+1}$ are connected in diode fashion (drain connected to gate), with their drains and gates connected to power supply line $V_{dd}HDR$, and their sources connected together to establish the power supply voltage on line $V_{dd}AR_m$. Again, in this embodiment of the invention, switch $29_m$ operates to short out bias devices $27'_{m,k}$, $27'_{m,k+1}$ in normal operation, in which case the power supply voltage on line $V_{dd}AR_m$ is the same as the voltage at power supply line $V_{dd}HDR$. In RTA mode, switch $29_m$ is turned off by control signal $RTA_m$ being inactive high, such that voltage on power supply line $V_{dd}AR_m$ is at a threshold voltage below the power supply voltage on line $V_{dd}HDR$, by operation of bias devices $27'_{m,k}$, $27'_{m,k+1}$ operating as forward-biased diodes. According to this embodiment of the invention, therefore, the DC leakage current can be substantially reduced while maintaining a voltage at or above the DRV for SRAM cells 12 when in RTA mode.

Figure 5E:
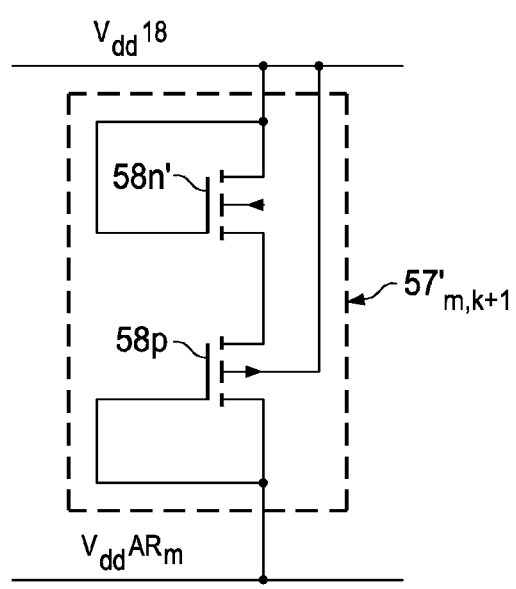
Figure 5B:
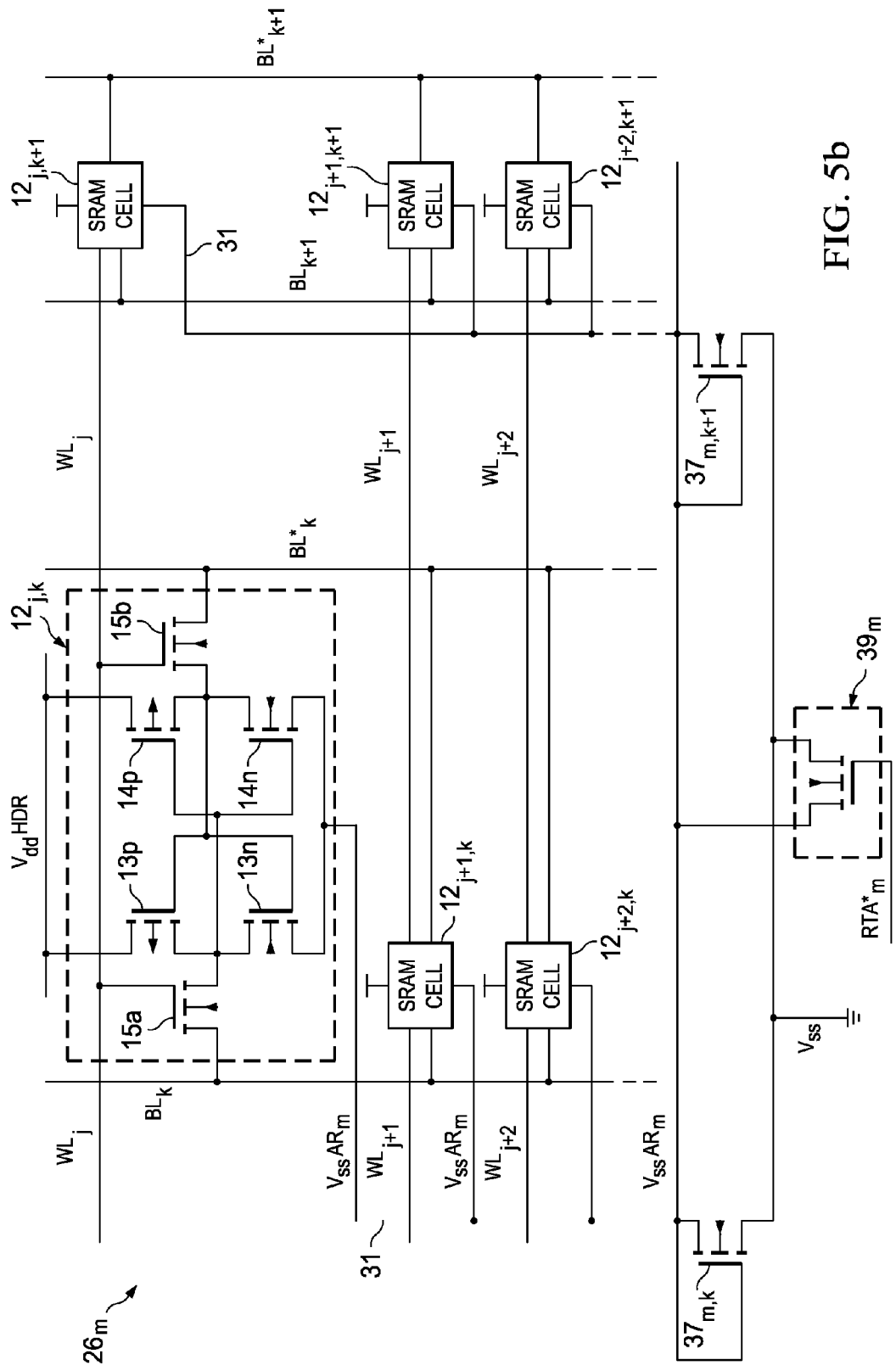

FIG. 5b illustrates memory array block $26_m$ according to another embodiment of the invention. In this example, bias devices $37_{m,k}$, $37_{m,k+1}$ are shown, in connection with columns k and k+1 of memory array block $26_m$, and in the form of "footers" to the bias arrangement of corresponding SRAM cells 12. In this example, all of SRAM cells 12 are biased by the power supply voltage at line $V_{dd}HDR$, which remains at the same voltage in both normal operation and also in RTA mode. The reduced bias in RTA mode is provided, in this case, by bias devices $37_m$ disposed between ground reference potential $V_{ss}$ (which may be a device ground, or which alternatively may be a generated or regulated low bias voltage, as desired) and reference voltage line $V_{ss}AR_m$. In this example, bias devices $37_m$ are n-channel MOS transistors connected in diode fashion, and as such have their gates and drains connected together to reference voltage line $V_{ss}AR_m$, and their sources at ground reference potential $V_{ss}$. Reference voltage line $V_{ss}AR_m$ is connected to SRAM cells 12 in all columns of memory array block $26_m$ via bias conductors 31, which provide the reference voltage potential to SRAM cells 12 (i.e., which bias the sources of driver transistors $13n$, $14n$ in each SRAM cell 12). Switch $39_m$ is an n-channel MOS transistor with its source-drain path connected between reference voltage line $V_{ss}AR_m$ and ground reference potential $V_{ss}$, and has a gate receiving control signal $RTA*_m$ (which indicates the RTA mode when at a low logic level).

The n-channel transistor realizing switch $39_m$ is a large size device constructed as a core transistor, and as such physically located outside of memory array region 25 within which memory array block $26_m$ is deployed. As discussed above for other embodiments of this invention, bias devices $37_m$ are formed within that memory array region 25, and are in the form of array transistors constructed similarly as n-channel transistors within SRAM cells 12.

In operation, during normal operation mode, control signal $RTA*_m$ is active high, which turns on switch $39_m$, shorting out bias devices $37_m$ and thus connecting reference voltage line $V_{ss}AR_m$ to ground reference potential $V_{ss}$. As a result, the reference voltage applied to SRAM cells 12 in memory array $26_m$ in this normal operating mode is ground reference potential $V_{ss}$ itself; this full bias level between the power supply voltage on line $V_{dd}AR$ and the ground reference potential $V_{ss}$ optimizes the read and write performance of SRAM cells 12, in this construction. In RTA mode, control signal RTA*$_m$ is asserted to a low logic level, which turns off switch 39$_m$. As a result, the voltage at reference voltage line V$_{ss}$AR$_m$ is at a threshold voltage above ground reference potential V$_{ss}$, considering that bias devices 37$_m$ serve as forward-biased diodes with switch 39$_m$. This higher reference voltage on reference voltage line V$_{ss}$AR$_m$ is applied as the reference voltage to SRAM cells 12 within memory array block 26$_m$, via conductors 31, and reduces the bias voltage across SRAM cells 12 (i.e., relative to the voltage at power supply line V$_{dd}$AR). This reduced voltage reduces the DC retention current drawn by SRAM cells 12, and is reflected in reduced power dissipation by at least the square of that voltage reduction.

Various alternatives to the arrangement of FIG. 5b will be apparent to those skilled in the art having reference to this specification. As discussed above relative to FIG. 3b, fewer than one bias device 37$_m$ per column can be utilized if so desired; further in the alternative, more than one bias device 27$_m$ per column can also be utilized if so desired. In addition, bias devices 37$_m$ in this embodiment are connected in parallel with one another, to provide the benefit of establishing the voltage on reference voltage line V$_{ss}$AR$_m$ in a more robust manner, less vulnerable to defects in any one of bias devices 37$_m$. Alternatively, as mentioned above, this parallel connection need not be used, in which case bias devices 37$_m$ may bias as few as a single column, for example if a "write assist" architecture is implemented as described in copending and commonly assigned U.S. patent application Ser. No. 12/764, 399 entitled "Combined Write Assist and Retain-Till-Accessed Memory Array Bias", filed contemporaneously herewith and incorporated herein by reference. In any event, the multiple bias devices 37$_m$ for memory array block 26$_m$, constructed as array devices, facilitate closer approach to the data retention voltage by the RTA bias, because the design margin required to account for variations in manufacturing parameters, power supply voltage, temperature, and the like can be narrowed because of the improved matching of bias devices 37$_m$ to the transistors in SRAM cells 12.

According to this embodiment of the invention, the DC leakage current can be substantially reduced while maintaining a voltage at or above the DRV for SRAM cells 12 when in RTA mode. However, this approach of FIG. 5b tends to reduce the current available in performing a read operation (i.e., the sink current pulling down a bit line from the accessed SRAM cell), which should be taken into account in selecting the desired RTA bias scheme according to this invention.

Figure 5C:
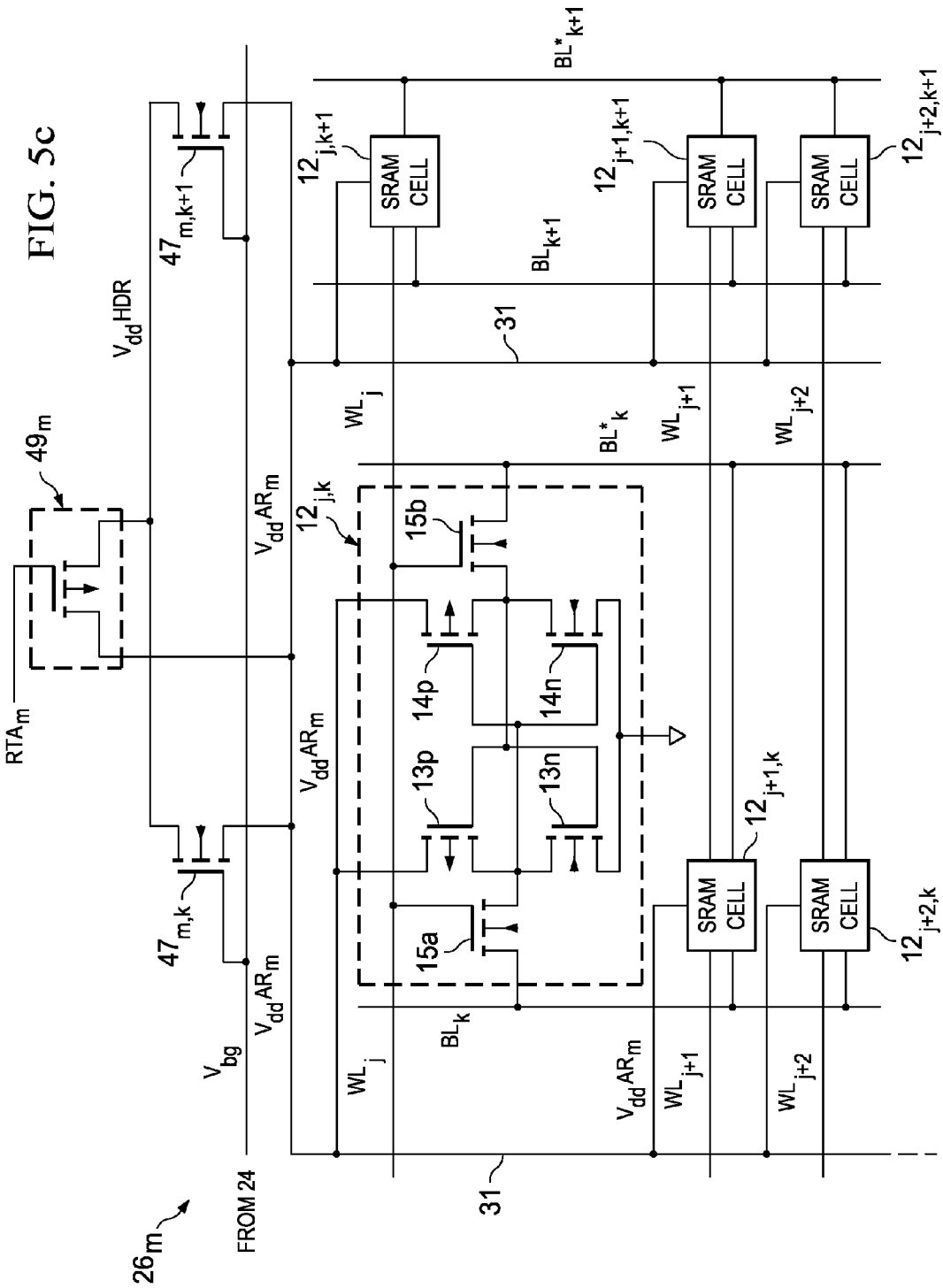

FIG. 5c schematically illustrates another alternative embodiment of this invention. In this embodiment of the invention, memory array block 26$_m$ is constructed essentially as described above relative to FIG. 5a. Bias devices 47$_{m,k}$, 47$_{m,k+1}$ are provided for columns k, k30 1 of memory array block 26$_m$ as shown, constructed as array transistors and as such physically located within memory array region 25 within which memory array block 26$_m$ is implemented. Bias devices 47$_m$ are n-channel MOS transistors connected in parallel with one another, with their drains connected to power supply line V$_{dd}$HDR, and their sources at power supply line V$_{dd}$AR$_m$. In this embodiment of the invention, the gates of bias devices 47$_m$ are connected to reference voltage line V$_{bg}$, which communicates a band-gap voltage or other regulated or generated voltage from power management circuitry 24 (FIG. 2). In effect, bias devices 47$_m$ operate as source followers in establishing the voltage at power supply line V$_{dd}$AR$_m$. It is contemplated that the gate voltage on reference voltage line V$_{bg}$ can be generated by power management circuitry 24 in the conventional manner, for example by way of a conventional bandgap reference circuit 19 as part of power management circuitry 24 (FIG. 2) or the like, at a selected or available voltage useful in establishing the voltage on power supply line V$_{dd}$AR$_m$ in RTA mode. Switch 49$_m$ is provided as before, in the form of a large p-channel MOS transistor realized as a core transistor, and thus physically located outside of memory array region 25 as described above.

The operation of this embodiment of the invention follows that described above in connection with FIG. 5a. It is contemplated, in such operation, that the voltage on line V$_{bg}$ can remain constant in the RTA and normal operation mode, considering that switch 49$_m$ controls whether the full power supply voltage on line V$_{dd}$HDR or the reduced RTA voltage is applied to power supply line V$_{dd}$AR$_m$.

As in the previously described embodiments of the invention, the construction of bias devices 47$_m$ as array transistors enables the RTA-mode power supply voltage to be set closer to the data retention voltage, because the design margin required to account for variations in manufacturing parameters, power supply voltage, temperature, and the like can be narrowed by such construction.

According to this embodiment of the invention shown in FIG. 5c, the DC leakage current can be substantially reduced while maintaining a voltage at or above the DRV for SRAM cells 12 when in RTA mode. However, this embodiment of the invention requires routing of reference voltage line V$_{bg}$ through memory array blocks 26, which not only increases the chip area required to realize memory array 25, but also complicates the routing of other signal and power lines. Those complexities should be taken into account in selecting the desired RTA bias scheme from among these embodiments of the invention.

Various alternatives to this embodiment of the invention are also contemplated. As mentioned above, bias devices 47$_m$ may be alternatively realized as p-channel transistors. Further in the alternative, the parallel connection of bias devices 47$_m$ may be broken, such that each bias device 47$_m$ is connected to as few as only a single column, rather than in parallel with the other bias devices 47$_m$ within a given memory array block 26$_m$.

The embodiments of this invention described above utilize single transistor bias devices. According to another embodiment of this invention, the bias devices for establishing the power supply voltage applied to SRAM cells in RTA mode each include more than one transistor. An example of this embodiment of the invention will now be described in detail, with reference to FIG. 5d.

Figure 5D:
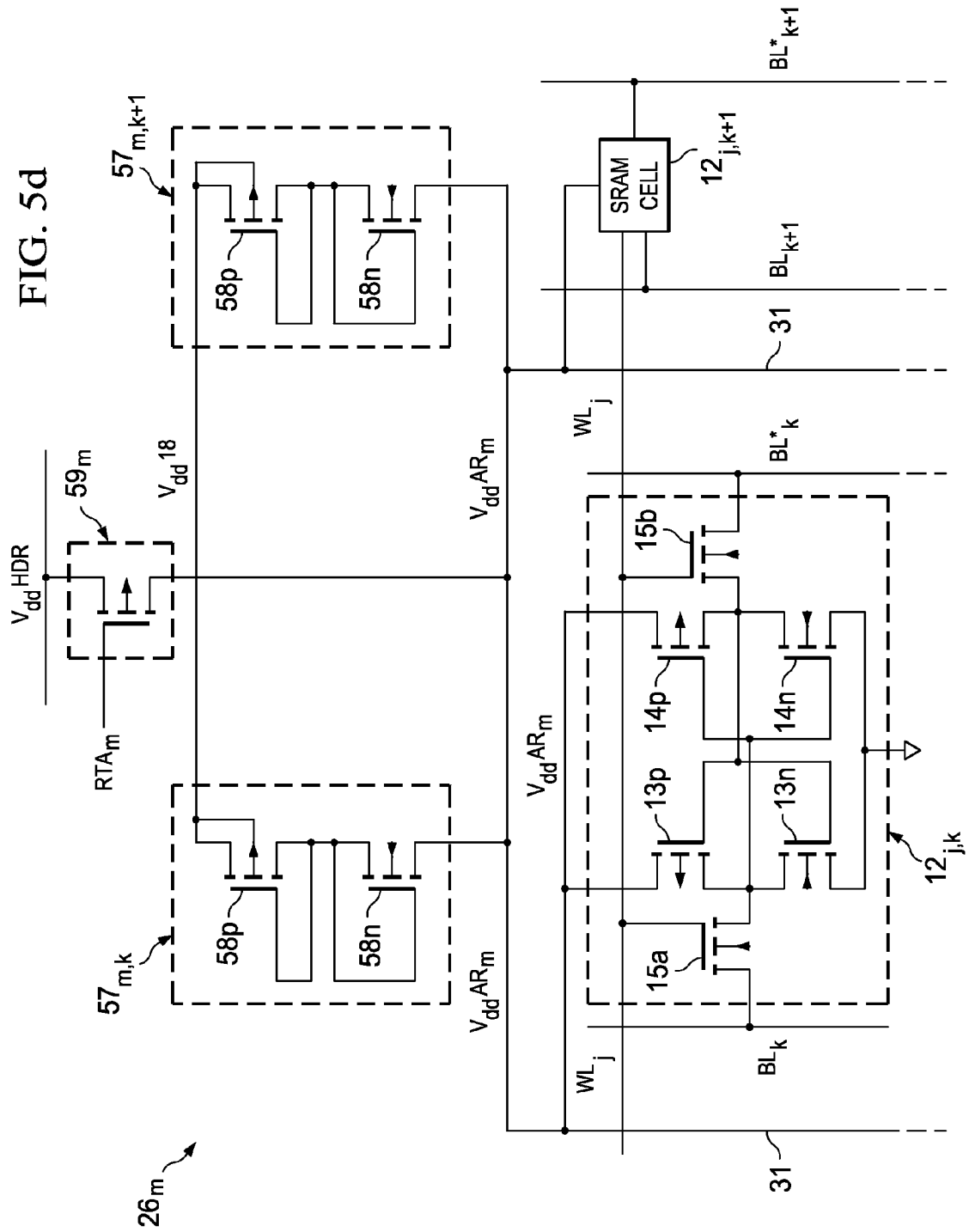

Memory array block 26$_m$ shown in FIG. 5d is constructed in similar manner as described above, including 6-T SRAM cells 12 arranged in rows and columns as before; two columns k, k+1 are illustrated in FIG. 5d by way of example. In this embodiment of the invention, one bias device 57$_k$ is provided for each column of memory array block 26$_m$, and as such FIG. 5d illustrates parallel-connected bias devices 57$_{m,k}$, 57$_{m,k+1}$ for respective columns k, k+1. In this embodiment of the invention, each bias device 57$_m$ includes p-channel transistor 58p and n-channel transistor 58n. P-channel transistor 58p has its source and body node connected to power supply line V$_{dd}$18, and its gate connected to its drain in diode fashion; n-channel transistor 58n has its drain and gate connected to the drain and gate of transistor 58p, and its source connected to power supply line V$_{dd}$AR$_m$, which in turn is connected to SRAM cells 12 via conductor 31 as before. Transistors 58p, 58n thus define complementary MOS diodes in series between power supply line V$_{dd}$18 and power supply line V$_{dd}$AR$_m$. As shown in FIG. 5d, in this embodiment of the invention, bias device $57_{m,k+1}$ is also connected between power supply line $V_{dd}18$ and power supply line $V_{dd}AR_m$, in parallel with bias device $57_m$.

Switch $59_m$ is provided for memory array block $26_m$, and in this embodiment of the invention is a relatively large p-channel MOS transistor with its source-drain path connected between power supply line $V_{dd}HDR$ and power supply line $V_{dd}AR_m$. The gate of switch $59_m$ receives control signal $RTA_m$ from power management circuitry 24 (FIG. 2). The large drive capability of switch $59_m$ enables it to rapidly short power supply line $V_{dd}AR_m$ to power supply line $V_{dd}HDR$ in normal operation.

As described above in connection with the other embodiments of the invention, transistors $58p$, $58n$ of bias devices $57_m$ are constructed as array transistors, and as such are constructed similarly as the transistors of SRAM cells 12. This allows bias devices $57_m$ to be physically arranged within memory array region 25, and within the area of memory block $26_m$, similarly as described above in connection with FIG. 4. On the other hand, in this embodiment of the invention, switch $59_m$ is constructed as a core transistor, and is physically located outside of memory array region 25; this construction enables switch $59_m$ to be fabricated to have large drive capability, which reduces recovery time from RTA mode to normal operation, without impacting the size and layout of memory array block $26_m$.

The voltage on power supply line $V_{dd}18$ is contemplated to be substantially higher than the power supply voltage to be applied in RTA mode (and also than that at power supply line $V_{dd}HDR$ used during normal operation). In the embodiments of the invention described above, the nominal power supply voltage on power supply line $V_{dd}HDR$ was contemplated to be about 1.1 volts, such that a typical threshold voltage drop from that voltage is near a DRV of about 0.6 volts. However, in this embodiment of the invention, multiple threshold voltage drops are involved within bias devices $57_m$, and as such it is contemplated that the voltage of power supply line $V_{dd}18$ will be somewhat higher than 1.1 volts, for example at about 1.8 volts. However, the voltage of power supply line $V_{dd}18$ is not contemplated to be so high above that of power supply line $V_{dd}HDR$ that bias devices $57_m$ conduct in normal operation (i.e., with switch $59_m$ turned on). This higher voltage power supply at line $V_{dd}18$ may be the same as that supplied to peripheral and logic circuitry within integrated circuit 20, or that applied to n-type well regions within which p-channel MOS transistors are realized within integrated circuit 20.

In operation, switch $59_m$ is turned on by control signal $RTA_m$ inactive low in the normal operating mode (i.e., when not in RTA mode). In that mode, the voltage at power supply line $V_{dd}HDR$ is then applied by closed switch $59_m$ to power supply line $V_{dd}AR_m$ to bias SRAM cells 12. In the RTA mode, switch $59_m$ is turned off by control signal $RTA_m$ being driven active high by power management circuitry 24, which allows bias devices $57_m$ to set the voltage at power supply line $V_{dd}AR_m$. In this embodiment of the invention, each of p-channel transistor $58p$ and n-channel transistor $58n$ in each bias device $57_m$ operate as a forward-biased MOS diode, with a steady-state voltage drop of about a threshold voltage across each. As a result, the voltage at power supply line $V_{dd}AR_m$ for memory array block $26_m$ in RTA mode is reduced from the normal operating mode voltage on power supply line $V_{dd}18$, yet remains above the DRV.

This embodiment of the invention also provides reduced DC current drawn by memory array block $26_m$ in RTA mode. As evident from FIG. 5d, additional chip area is required to realize two transistors for each bias device $57_m$, and also requires routing of the higher voltage power supply line $V_{dd}18$ into memory array region 25. However, it is contemplated that the use of complementary p-channel transistor $58p$ and n-channel transistor $58n$ in each bias device $57_m$ provides good correlation of the voltage drop across bias device $57_m$ with the leakage current of SRAM cells 12. As a result, the bias voltage increases (decreasing voltage drop across bias device $57_m$) with increases in leakage current, which satisfies the higher data retention voltage required by leakier SRAM cells.

Alternatively, the two-diode arrangement of FIGS. 5d and 5e could be realized by reversing the position of transistors $58n$, $58p$, with the drain and gate of an re-channel MOS transistor connected to power supply line $V_{dd}18$, the drain and gate of a p-channel MOS transistor connected to power supply line $V_{dd}AR_m$, and the two transistors having their source nodes connected together. This arrangement is shown in FIG. 5e, in which bias device $57'_m$ is constructed to include p-channel transistor $58p'$ and n-channel transistor $58n'$. The drain and gate of transistor $58n'$, and the body node of transistor $58p'$, are connected to power supply line $V_{dd}18$, and the source of transistor $58p'$ is connected to the source of n-channel transistor $58n'$. The drain and gate of transistor $58p'$ is connected to power supply line $V_{dd}AR_m$. This construction of bias device $57'_m$ is thus essentially the complement of bias device $57_m$ of FIG. 5e, and operates in largely the same fashion.

Further in the alternative, the series-connected diodes may both be of the same channel conductivity. And, of course, more than two devices may be connected in series according to this embodiment of the invention.

Figure 5F:
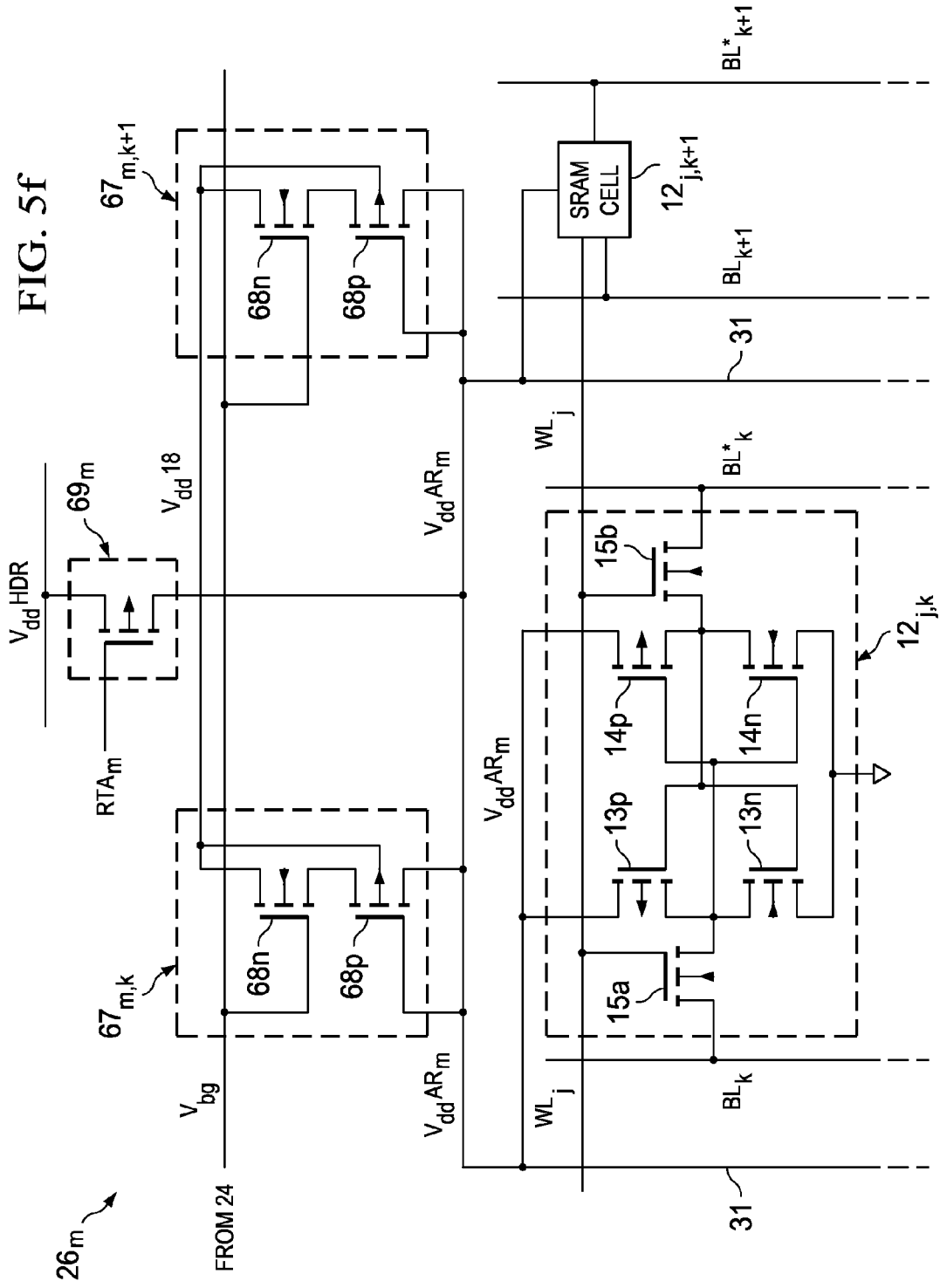

FIG. 5f illustrates an alternative realization of the multiple-transistor construction of the RTA bias devices, in connection with bias devices $67_m$ for memory array block $26_m$. The arrangement of FIG. 5f is constructed as described above for the embodiment of the invention shown in FIG. 5d, with each of bias devices $67_m$ for the columns of memory array block $26_m$ constructed by way of array transistors $68n$, $68p$ connected in series between power supply line $V_{dd}18$ and power supply line $V_{dd}AR_m$, and with switch $69_m$ formed of a core p-channel transistor with its source-drain path connected between power supply lines $V_{dd}HDR$ and $V_{dd}AR_m$, and its gate receiving control signal $RTA_m$.

In the embodiment of the invention shown in FIG. 5f, however, each instance of bias devices $67_m$ is constructed by way of n-channel transistor $68n$ having its drain connected to power supply line $V_{dd}18$, and p-channel transistor $68p$ with its source connected to the source of transistor $68n$. The drain and gate of transistor $68p$ is connected to power supply line $V_{dd}AR_m$, while the body node of transistor $68p$ is connected to power supply line $V_{dd}18$ (as are the body nodes of the p-channel transistors in SRAM cells 12 in this example). The gate of transistor $68n$ receives reference voltage $V_{bg}$, for example as generated by a bandgap reference circuit 19 or another voltage reference circuit, in power management circuitry 24 or elsewhere within the integrated circuit. The reference voltage on line $V_{bg}$ is selected to provide the desired voltage drop across bias devices $67_m$; alternatively, if a reference voltage near the optimal level is conveniently available to bias devices $67_m$, from the standpoint of routing, that reference voltage may be applied to the gate of transistor $68n$ in bias devices $67_m$. In any case, the combination of transistors $68n$, $68p$ in bias devices $67_m$, along with the appropriate bias level, establishes a voltage drop from the voltage at power supply line $V_{dd}18$ to power supply line $V_{dd}AR_m$.

In operation, the voltage at power supply line $V_{dd}18$ is contemplated to be a relatively high voltage, for example on the order of about 1.8 volts in modern integrated circuits; this voltage is contemplated to correspond to the power supply level applied to logic and peripheral circuitry within integrated circuit 20. In the normal operating mode, during which switch $69_m$ is turned on (closed) to short circuit power supply line $V_{dd}AR_m$ to power supply line $V_{dd}HDR$, which biases SRAM cells 12 in memory array block $26_m$ for read and write accesses. Upon memory array block $26_m$ being placed into the RTA mode, switch $69_m$ is turned off (opened). This allows the voltage of power supply line $V_{dd}AR_m$ to be established at a level corresponding to the voltage drops across bias devices $67_m$, defined by the sum of the voltage drops across transistors $68n$, $68p$, relative to power supply line $V_{dd}18$.

Bias device $67_m$ enables the establishment of a robust RTA power supply bias voltage to SRAM cells 12 in associated memory array block $26_m$. This RTA bias voltage is of course reduced to a level at or near the DRV of SRAM cells 12, and enables substantial reduction in the DC leakage current and thus power consumption in the RTA mode. Those skilled in the art having reference to this specification will recognize that the embodiment of the invention shown in FIG. 5f involves not only two transistors per bias device, but also require routing of reference voltage line $V_{bg}$ as well as the high voltage power supply line $V_{dd}18$.

And as discussed above repeatedly, while FIG. 5f illustrates one bias device $67_m$ for each column of SRAM cells 12 in memory array $26_m$, each bias device $67_m$ may support more than one column, if desired. As described above, the parallel connection of bias devices $67_m$ in this embodiment of the invention provides a robust RTA mode voltage on power supply line $V_{dd}AR_m$, because defects in any one of those devices will not unduly degrade any single column of SRAM cells 12. However, if desired and as mentioned above, bias device $67_m$ may individually bias as few as a single column; such an arrangement is beneficial if "write assist" is implemented, as described in copending and commonly assigned U.S. patent application Ser. No. 12/764,399 entitled "Combined Write Assist and Retain-Till-Accessed Memory Array Bias", filed contemporaneously herewith and incorporated herein by reference.

In the embodiments of this invention shown in FIGS. 5d through 5f and alternatives to these embodiments, the construction of bias devices $57_m$, $67_m$ as array devices ensures good matching with the transistors of SRAM cells 12. This enables the resulting RTA power supply bias to be placed closer to the data retention voltage, because the design margin required to account for variations in manufacturing parameters, power supply voltage, temperature, and the like can be narrowed as a result of this improved matching.

It is contemplated that additional alternatives and variations to the embodiments of this invention described above will be apparent to those skilled in the art having reference to this specification, such alternatives and variations including the implementation of these approaches in solid-state memories of various types, constructed according to various technologies, and as may be embedded within larger-scale integrated circuits. Therefore, while the present invention has been described according to some of its embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A semiconductor static random-access memory operable in a normal operating mode and a retain-till-accessed (RTA) mode, comprising:
    a plurality of memory cells, arranged in rows and columns in at least one memory array block, each of the plurality of memory cells comprised of metal-oxide-semiconductor (MOS) array transistors, and disposed in a memory array region of an integrated circuit, each of the memory cells in a first memory array block biased in parallel between a first bias voltage node and a first power supply node;
    a first plurality of bias devices, disposed in the memory array region and associated with the first memory array block, each of the first plurality of bias devices having a conduction path connected in series with memory cells in its associated memory array block between a second power supply node and the first bias voltage node; and
    a first switch device, disposed outside of the memory array region of the integrated circuit, and having a conduction path connected between the second power supply node and the first bias voltage node, and having a control electrode receiving an RTA control signal so that the first switch device is turned on in the normal operating mode and turned off in the RTA mode.

2. The memory of claim 1, wherein the first power supply node corresponds to a ground potential;
    and wherein the second power supply node corresponds to a positive polarity power supply voltage.

3. The memory of claim 1, wherein the first power supply node corresponds to a positive polarity power supply voltage;
    and wherein the second power supply node corresponds to a ground potential.

4. The memory of claim 1, further comprising:
    power management circuitry for generating the RTA control signal.

5. The memory of claim 1, wherein each of the first plurality of bias devices is associated with a single column of memory cells in the first memory array block.

6. The memory of claim 5, wherein the conduction paths of the first plurality of bias devices are connected in parallel with one another.

7. The memory of claim 1, wherein the conduction paths of the first plurality of bias devices are connected in parallel with one another.

8. The memory of claim 1, further comprising:
    functional circuitry, coupled to the at least one memory array block, disposed in a core region of the integrated circuit and comprised of MOS core transistors, the MOS core transistors having different construction from the MOS array transistors;
    and wherein the first switch device is disposed in the core region and constructed as a MOS core transistor.

9. The memory of claim 1, wherein each of the first plurality of bias devices comprises:
    an MOS array transistor having a source-drain path connected between the second power supply node and the first bias voltage node, and having a gate connected to its drain.

10. The memory of claim 1, further comprising:
    a voltage reference circuit, for generating a bias reference voltage;
    and wherein each of the first plurality of bias devices comprises:
    an MOS array transistor having a source-drain path connected between the second power supply node and the first bias voltage node, and having a gate receiving the bias reference voltage from the voltage reference circuit.

11. The memory of claim 1, wherein each of the first plurality of bias devices comprises:
a first MOS array transistor having a source-drain path, and having a gate connected to its drain;
a second MOS array transistor having a source-drain path connected in series with the first MOS array transistor between the second power supply node and the first bias voltage node, and having a gate connected to its drain.

12. The memory of claim 1, further comprising:
a voltage reference circuit, for generating a bias reference voltage;
and wherein each of the first plurality of bias devices comprises:
a first MOS array transistor having a source-drain path, and having a gate connected to its drain;
a second MOS array transistor having a source-drain path connected in series with the first MOS array transistor between the second power supply node and the first bias voltage node, and having a gate receiving the bias reference voltage from the voltage reference circuit.

13. The memory of claim 1, wherein the plurality of memory cells are arranged in rows and columns in a plurality of memory array blocks;
and further comprising:
a second plurality of bias devices, disposed in the memory array region and associated with a second memory array block, each of the second plurality of bias devices having a conduction path connected in series with memory cells in its associated memory array block between the second power supply node and a second bias voltage node; and
a second switch device, disposed outside of the memory array region of the integrated circuit, and having a conduction path connected between the second power supply node and the second bias voltage node, and having a control electrode receiving an RTA control signal so that the second switch device is turned on in the normal operating mode and turned off in the RTA mode.

14. The memory of claim 13, wherein the first and second memory array blocks are of different memory sizes.

15. The memory of claim 1, wherein the memory is formed at a semiconductor surface of a substrate;
wherein the first and second memory array blocks are disposed within a memory array region of the surface;
wherein metal conductors corresponding to the first bias voltage node and the second power supply node are disposed, at least in part, within the memory array region;
and wherein the first plurality of bias devices is disposed within the memory array region between the metal conductors corresponding to the first bias voltage node and the second power supply node.

16. A method of operating a memory in a normal operating mode and a retain-till-accessed (RTA) mode;
wherein the memory comprises;
a plurality of memory cells, arranged in rows and columns in at least one memory array block, each of the plurality of memory cells comprised of metal-oxide-semiconductor (MOS) array transistors, and disposed in a memory array region of an integrated circuit, each of the memory cells in a first memory array block biased in parallel between a first bias voltage node and a first power supply node; and
a first plurality of bias devices, disposed in the memory array region and associated with the first memory array block, each of the first plurality of bias devices having a conduction path connected in series with memory cells in its associated memory array block between a second power supply node and the first bias voltage node;
the method comprising the steps of:
in the normal operating mode for a first memory array block, closing a first switch between the second power supply node and the first bias voltage node; and
in the RTA mode for the first memory array block, opening the first switch.

17. The method of claim 16, wherein the memory further comprises:
a second plurality of bias devices, disposed in the memory array region and associated with a second memory array block, each of the second plurality of bias devices having a conduction path connected in series with memory cells in its associated memory array block between the second power supply node and a second bias voltage node for the second memory array block;
in the normal operating mode for the second memory array block, closing a second switch between the second power supply node and the second bias voltage node for the second memory array block; and
in the RTA mode for the second memory array block, opening the second switch;
wherein the step of opening the second switch is performed during the step of closing the first switch, so that the second memory array block is in RTA mode while the first memory array block is in the normal operating mode.

18. The method of claim 16, wherein the memory further comprises:
functional circuitry, coupled to the at least one memory array block, disposed in a core region of the integrated circuit and comprised of MOS core transistors, the MOS core transistors having different construction from the MOS array transistors;
wherein the step of closing the first switch comprises:
turning on a first MOS core transistor disposed in the core region;
and wherein the step of opening the first switch comprises:
turning off the first MOS core transistor.

19. The method of claim 16, wherein each of the first plurality of bias devices comprises:
a first MOS array transistor connected as a diode.

20. The method of claim 19, wherein each of the first plurality of bias devices further comprises:
a second MOS array transistor connected as a diode, and connected in series with the first MOS array transistor.

21. The method of claim 16, wherein each of the first plurality of bias devices comprises:
a first MOS array transistor having a source-drain path connected between the second power supply node and the first bias voltage node, and having a gate;
and wherein the method further comprises:
generating a bias reference voltage; and
applying the bias reference voltage to the gate of each of the first MOS array transistors in the first plurality of bias devices.

22. The method of claim 21, wherein each of the first plurality of bias devices further comprises:
a second MOS array transistor having a source-drain path connected in series with the source-drain path of the first MOS array transistor, and having a gate connected to its drain.

23. The method of claim 16, further comprising:
coupling the first power supply node to a ground potential; and
coupling the second power supply node to a positive polarity power supply voltage.

24. The method of claim 16, further comprising:
coupling the first power supply node to a positive polarity power supply voltage; and
coupling the second power supply node to a ground potential.

* * * * *